US007776396B2

(12) United States Patent
Kobrin et al.

(10) Patent No.: US 7,776,396 B2
(45) Date of Patent: Aug. 17, 2010

(54) CONTROLLED VAPOR DEPOSITION OF MULTILAYERED COATINGS ADHERED BY AN OXIDE LAYER

(75) Inventors: Boris Kobrin, Walnut Creek, CA (US); Jeffrey D. Chinn, Foster City, CA (US); Romuald Nowak, Cupertino, CA (US); Richard C. Yi, Santa Cruz, CA (US)

(73) Assignee: Applied Microstructures, Inc., San Jose, CA (US)

( * ) Notice: Subject to any disclaimer, the term of this patent is extended or adjusted under 35 U.S.C. 154(b) by 1321 days.

(21) Appl. No.: 11/112,664

(22) Filed: Apr. 21, 2005

(65) Prior Publication Data

US 2005/0271900 A1 Dec. 8, 2005

Related U.S. Application Data

(63) Continuation-in-part of application No. 10/996,520, filed on Nov. 23, 2004, now abandoned, which is a continuation-in-part of application No. 10/862,047, filed on Jun. 4, 2004.

(51) Int. Cl.
*C23C 16/40* (2006.01)

(52) U.S. Cl. .............................. 427/255.29; 427/255.6; 427/255.7; 438/763; 438/780; 438/785; 438/790

(58) Field of Classification Search ............ 427/255.28, 427/255.6, 255.7; 438/763, 780, 785, 790
See application file for complete search history.

(56) References Cited

U.S. PATENT DOCUMENTS

| | | | | |
|---|---|---|---|---|
| 4,002,512 A | | 1/1977 | Lim | |
| 4,188,444 A | | 2/1980 | Landau | |
| 4,780,334 A | * | 10/1988 | Ackerman | 427/248.1 |
| 4,940,854 A | * | 7/1990 | Debe | 428/411.1 |
| 4,956,204 A | | 9/1990 | Amazawa et al. | 427/248.1 |
| 4,992,306 A | * | 2/1991 | Hochberg et al. | 427/255.29 |
| 5,087,525 A | | 2/1992 | Goodman et al. | |
| 5,240,774 A | | 8/1993 | Ogawa et al. | |
| 5,314,724 A | * | 5/1994 | Tsukune et al. | 427/489 |
| 5,328,768 A | | 7/1994 | Goodwin | 428/428 |
| 5,352,485 A | * | 10/1994 | DeGuire et al. | 427/226 |
| 5,372,851 A | | 12/1994 | Ogawa et al. | 427/255.7 |
| 5,411,769 A | | 5/1995 | Hornbeck | 427/534 |
| 5,459,099 A | | 10/1995 | Hsu | 999/180 |
| 5,480,488 A | | 1/1996 | Bittner et al. | |
| 5,576,247 A | | 11/1996 | Yano et al. | 437/225 |
| 5,602,671 A | | 2/1997 | Hornbeck | 359/224 |
| 5,620,910 A | | 4/1997 | Teramoto | 999/40 |
| 5,626,924 A | | 5/1997 | Ishikawa | 427/759 |
| 5,736,207 A | | 4/1998 | Walther et al. | |
| 5,804,259 A | * | 9/1998 | Robles | 427/577 |
| 5,879,459 A | | 3/1999 | Gadgil et al. | |
| 5,966,499 A | | 10/1999 | Hinkle et al. | |
| 5,989,345 A | | 11/1999 | Hatano | |
| 6,051,448 A | | 4/2000 | Hayama et al. | 438/108 |
| 6,068,884 A | * | 5/2000 | Rose et al. | 438/762 |
| 6,165,566 A | * | 12/2000 | Tropsha | 427/536 |
| 6,203,505 B1 | | 3/2001 | Jalisi et al. | 600/585 |
| 6,225,237 B1 | * | 5/2001 | Vaartstra | 438/778 |
| 6,258,229 B1 | | 7/2001 | Winarta et al. | 204/403 |
| 6,358,863 B1 | * | 3/2002 | Desu et al. | 438/763 |
| 6,383,642 B1 | | 5/2002 | Le Bellac et al. | 428/412 |
| 6,391,803 B1 | | 5/2002 | Kim et al. | |
| 6,399,222 B2 | | 6/2002 | Arai et al. | 428/690 |
| 6,465,108 B1 | | 10/2002 | Kamitani et al. | |
| 6,503,330 B1 | | 1/2003 | Sneh et al. | |
| 6,521,334 B1 | | 2/2003 | Ogawa et al. | |
| 6,576,489 B2 | | 6/2003 | Leung et al. | 438/52 |
| 6,737,105 B2 | | 5/2004 | Richard | 427/162 |
| 6,743,516 B2 | | 6/2004 | Murphy et al. | 428/447 |
| 6,743,736 B2 | | 6/2004 | Mardian et al. | |

(Continued)

FOREIGN PATENT DOCUMENTS

| | | |
|---|---|---|
| JP | 11116278 | 4/1999 |
| JP | 2003-276110 | 9/2003 |
| WO | WO 02/28956 | 4/2002 |

OTHER PUBLICATIONS

Perez-Mariano, J. et al., "Multilayer coatings by chemical vapor deposition in a fluidized bed reactor at atmospheric pressure (AP/FBR-CVD): TiN/TaN and TiN/W". Surface and Coatings Technology, vol. 201, Issue 6, Dec. 4, 2006, pp. 2174-2180.*
International Search Report of corresponding PCT Application No. PCT/US05/18313.
B. Arkles, "Tailoring surfaces with silanes", Chemtech, pp. 766-776 (Dec. 1977).
W. R. Ashurst et al., "Wafer Level Anti-Stiction Coatings With Superior Thermal Stability", Presentation at Hilton Head, South Caroline meeting, pp. 1-4 (Jun. 2002). Contact ashurbr@uclink4.berkeley.edu.
W. R. Ashurst et al., "Wafer level anti-stiction coatings for MEMS", Sensors and Actuators A, Elsevier Science B.V., vol. 104, pp. 213-221 (2003).

(Continued)

*Primary Examiner*—Bret Chen
(74) *Attorney, Agent, or Firm*—Martine Penilla & Gencarella, LLP

(57) ABSTRACT

An improved vapor-phase deposition method and apparatus for the application of multilayered films/coatings on substrates is described. The method is used to deposit multilayered coatings where the thickness of an oxide-based layer in direct contact with a substrate is controlled as a function of the chemical composition of the substrate, whereby a subsequently deposited layer bonds better to the oxide-based layer. The improved method is used to deposit multilayered coatings where an oxide-based layer is deposited directly over a substrate and an organic-based layer is directly deposited over the oxide-based layer. Typically, a series of alternating layers of oxide-based layer and organic-based layer are applied.

42 Claims, 16 Drawing Sheets

U.S. PATENT DOCUMENTS

| | | | |
|---|---|---|---|
| 6,905,549 | B2 | 6/2005 | Okuda et al. |
| 7,208,195 | B2* | 4/2007 | Kalynushkin et al. .... 427/248.1 |
| 2001/0028924 | A1 | 10/2001 | Sherman ................ 427/255.28 |
| 2002/0031618 | A1 | 3/2002 | Sherman ..................... 427/569 |
| 2002/0033229 | A1 | 3/2002 | Lebouitz et al. ............. 156/345 |
| 2002/0064663 | A1 | 5/2002 | Murphy et al. .............. 428/447 |
| 2002/0076507 | A1 | 6/2002 | Chiang et al. ............... 427/569 |
| 2002/0146725 | A1 | 10/2002 | Mullen et al. .................. 435/6 |
| 2002/0164420 | A1 | 11/2002 | Derderian et al. |
| 2002/0164824 | A1 | 11/2002 | Xiao et al. .................. 436/524 |
| 2002/0195950 | A1 | 12/2002 | Mikhael et al. ........ 315/111.21 |
| 2003/0035904 | A1 | 2/2003 | Hsieh et al. ................. 427/569 |
| 2003/0040173 | A1 | 2/2003 | Fonash et al. ............... 438/622 |
| 2003/0062081 | A1 | 4/2003 | Maruyama et al. .......... 136/258 |
| 2003/0080087 | A1 | 5/2003 | Stetzle ......................... 216/27 |
| 2003/0138645 | A1 | 7/2003 | Gleason et al. ............. 428/447 |
| 2003/0180458 | A1 | 9/2003 | Sneh |
| 2003/0180544 | A1 | 9/2003 | Murphy ...................... 428/428 |
| 2004/0077184 | A1 | 4/2004 | Anderson et al. |
| 2004/0182316 | A1 | 9/2004 | Watanabe |
| 2004/0261703 | A1 | 12/2004 | Kobrin et al. |
| 2005/0079708 | A1* | 4/2005 | Yamasaki et al. ........... 438/680 |
| 2005/0081787 | A1 | 4/2005 | Im et al. |
| 2005/0095422 | A1 | 5/2005 | Sager et al. |
| 2005/0109277 | A1 | 5/2005 | Kobrin et al. |
| 2005/0118428 | A1* | 6/2005 | Bicker et al. ............. 428/411.1 |

OTHER PUBLICATIONS

M. V. Collins et al., "Optimization of Anodic Bonding to MEMS with Self-Assembled Monolayer (SAM) Coatings", Reliability, Testing, and Characterization of MEMS/MOEMS, Proceedings of SPIE, vol. 4558, pp. 234-241 (2001).

D. J. Ehrlich et al., "Fast room-temperature growth of $SiO_2$ films by molecular-layer dosing" Appl. Phys. Lett., vol. 58, No. 23, pp. 2675-2677 (Jun. 1991).

M. G. Hankins, "Vapor Deposition of Amino-Functionalized Self-Assembled Monolayers on MEMS", Reliability, Testing, and Characterization of MEMS/MOEMS, Proceedings of SPIE, vol. 4980, pp. 238-247 (2003).

S. A. Henck, "Lubrication of digital micromirror devices™", Tribology Letters, vol. 3, pp. 239-247 (1997).

P. W. Hoffmann et al., "Vapor Phase Self-Assembly of Fluorinated Monolayers on Silicon and Germanium Oxide", Langmuir, Vol. 13, pp. 1877-1880 (1997).

A. Hozumi et al., "Amino-terminated self-assembled monolayer on a $SiO_2$ surface formed by chemical vapor deposition", J. Vac. Sci. Technol. A, vol. 19, No. 4, pp. 1812-1816 (Jul./Aug. 2001).

X. Jia et al., "Controlled Growth of Silicon Dioxide from 'Nanoholes' in Silicon-Supported Tris(trimethylsiloxy)silyl Monolayers: Rational Control of Surface Roughness at the Nanometer Length Scale", Langmuir, vol. 19, pp. 2449-2457 (2003).

B. H. Kim, "A New Organic Modifier for Anti-Stiction", Journal of Microelectromechanical Systems, vol. 10, No. 1, pp. 33-40 (Mar. 2001).

J. W. Klaus et al., "$SiO_2$ Chemical Vapor Deposition at Room Temperature Using $SiCl_4$ and $H_2O$ with an $NH_3$ Catalyst", J. Electrochem. Soc., vol. 147, No. 7, pp. 2658-2664 (2000).

R. Maoz et al., "Self-Assembling Monolayers in the Construction of Planned Supramolecular Structures and as Modifiers of Surface Properties", Journal de chimie physique, vol. 85, No. 11/12 (1988).

T. M. Mayer et al., "Chemical vapor deposition of fluoroalkylsilane monolayer films for adhesion control in microelectromechanical systems", J. Vac. Sci. Technol. B, vol. 18, No. 5, pp. 2433-2440 (Sep./Oct. 2000).

J. Sagiv, "Organized Monolayers by Adsorption. 1. Formation and Structure of Oleophobic Mixed Monolayers on Solid Surfaces", J. Amer. Chem. Soc., vol. 102, No. 1, pp. 92-98 (Jan. 1980).

J. Sakata et al., "Anti-Stiction Silanization Coating to Silicon Microstructures by a Vapor Phase Deposition Process", Transducers, pp. 1-4 (1999).

O. Sneh et al., "Atomic Layer Growth of $SiO_2$ on Si(100) Using the Sequential Deposition of $SiCl_4$ and $H_2O$", Mat. Res. Soc. Symp. Proc., vol. 334, pp. 25-30 (1994).

J. Wang et al., "Gold nanoparticulate film bound to silicon surface with self-assembled monolayers", Thin Solid Films, Elsevier Science S.A., pp. 591-594 (1998).

X. Wang et al., "Gas-Phase Silicon Etching with Bromine Trifluoride", Transducers, International Conference on Solid State Sensors and Actuators, Chicago, pp. 1505-1508 (Jun. 1997).

Y. Wang et al., "Vapor phase deposition of uniform and ultrathin silanes", SPIE, vol. 3258, pp. 20-28 (1998).

International Search Report of PCT Application No. PCT/US2006/02264.

Abstract of Japanese Patent Publication No. 2003-276110, Publication. Date: Sep.30, 2003, Patent Abstracts of Japan.

* cited by examiner

CONTROLLED VAPOR DEPOSITION OF MULTILAYERED COATINGS ADHERED BY AN OXIDE LAYER

This application is a continuation-in-part application of U.S. patent application Ser. No. 10/996,520, filed Nov. 23, 2004, now abandoned and entitled "Controlled Vapor Deposition of Multilayered Coatings Adhered by an Oxide Layer", which is currently pending, which is a continuation-in-part application of U.S. patent application Ser. No. 10/862,047, filed Jun. 4, 2004, and entitled "Controlled Deposition of Silicon-Containing Coatings Adhered By An Oxide Layer", which is currently pending. U.S. application Ser. No. 10/862,047 is related to, but does not claim priority under, Provisional Application Ser. No. 60/482,861, filed Jun. 27, 2003, and entitled "Method And Apparatus for Mono-Layer Coatings"; Provisional Application Ser. No. 60/506,864, filed Sep. 30, 2003, and entitled "Method Of Thin Film Deposition"; Provisional Application Ser. No. 60/509,563, filed Oct. 9, 2003, and entitled "Method of Controlling Monolayer Film Properties"; and, to U.S. patent application Ser. No. 10/759,857, filed Jan. 16, 2004, which claims priority under the provisional applications listed above.

BACKGROUND OF THE INVENTION

1. Field of the Invention

The present invention pertains to a method, and to the resulting structure which is created by depositing a multilayered coating in a manner such that the thickness, mechanical properties, and surface properties of the multilayered coating provide functionality on a nanometer scale. The method is described with reference to at least one oxide-based layer which is chemically bonded to an underlying structure, and to at least one overlying layer which is adhered by chemical bonding to the oxide layer.

2. Brief Description of the Background Art

Integrated circuit (IC) device fabrication, micro-electromechanical systems (MEMS) fabrication, microfluidics, and microstructure fabrication in general make use of layers or coatings of materials which are deposited on a substrate for various purposes; In some instances, the layers are deposited on a substrate and then are subsequently removed, such as when the layer is used as a patterned masking material and then is subsequently removed after the pattern is transferred to an underlying layer. In other instances, the layers are deposited to perform a function in a device or system and remain as part of the fabricated device. There are numerous methods for depositing a thin film or a coating, such as, for example: Sputter deposition, where an ion plasma is used to sputter atoms from a target material (commonly a metal), and the sputtered atoms deposit on the substrate; chemical vapor deposition, where activated (e.g. by means of plasma, radiation, or temperature, or a combination thereof) species react either in a vapor phase (with subsequent deposition of the reacted product on the substrate) or react on the substrate surface to produce a reacted product on the substrate; evaporative deposition, where evaporated material condenses on a substrate to form a layer; and, spin-on, spray-on, wiped, or dipped-on deposition, typically from a solvent solution of the coating material, where the solvent is subsequently rinsed or evaporated off to leave the coating material on the substrate.

In many applications where the wear on the coating is likely to occur due to mechanical contact or where fluid flow is to occur over the substrate surface on which the layer of coating is present, it is helpful to have the coating chemically bonded directly to the substrate surface via chemical reaction of active species which are present in the coating reactants/materials with active species on the substrate surface. In addition, particular precursor materials may be selected which are known to provide particular functional moieties.

With respect to layers and coatings which are chemically bonded to the substrate surface, there are a number of areas of particular current interest. By way of example, and not by way of limitation, such coatings may be used for biotechnology applications, where the surface wetting properties and functionality of the coating are useful for analytical purposes, for controlling fluid flow and sorting of fluid components, and for altering the composition of components which come into contact with the surface, for example. Such coatings may also be used in the field of integrated circuitry, or when there is a combination of integrated circuitry with mechanical systems, which are referred to as micro-electromechanical systems, or MEMS. Due to the nanometer size scale of some of applications for coatings exhibiting specialized functionality, a need has grown for improved methods of controlling the formation of the coating, including the formation of individual layers within a multilayered coating. Historically, these types of coatings were deposited by contacting a substrate surface with a liquid phase. While this technique enables efficient coating deposition, it frequently results in limited film property control. In the case of coating a surface of a nanometer scale device, use of liquid phase processing limits device yield due to contamination and capillary forces. More recently, deposition of coatings from a vapor-phase has been used in an attempt to improve coating properties. However, the common vapor-phase deposition methods may not permit sufficient control of the molecular level reactions taking place during the deposition of surface bonding layers or during the deposition of functional coatings, when the deposited coating needs to function on a nanometer (nm) scale.

For purposes of illustrating methods of coating formation where liquid-based precursors are used to deposit a coating on a substrate, or where vaporous precursors are deposited to form a coating on a substrate, applicants would like to mention the following publications and patents which relate to methods of coating formation, by way of example. Most of the background information provided is with respect to various chlorosilane-based precursors; however it is not intended that the present invention be limited to this class of precursor materials. In addition, applicants would like to make it clear that some of this Background Art is not prior art to the present invention. It is mentioned here because it is of interest to the general subject matter.

In an article by Barry Arkles entitled "Tailoring surfaces with silanes", published in CHEMTECH, in December of 1977, pages 766-777, the author describes the use of organo silanes to form coatings which impart desired functional characteristics to an underlying oxide-containing surface. In particular, the organo silane is represented as $R_nSiX_{(4-n)}$ where X is a hydrolyzable group, typically halogen, alkoxy, acyloxy, or amine. Following hydrolysis, a reactive silanol group is said to be formed which can condense with other silanol groups, for example, those on the surface of siliceous fillers, to form siloxane linkages. Stable condensation products are said to be formed with other oxides in addition to silicon oxide, such as oxides of aluminum, zirconium, tin, titanium, and nickel. The R group is said to be a nonhydrolyzable organic radical that may possess functionality that imparts desired characteristics. The article also discusses reactive tetra-substituted silanes which can be fully substituted by hydrolyzable groups and how the silicic acid which is formed from such substituted silanes readily forms polymers such as silica gel, quartz, or silicates by condensation of the silanol groups or reaction of silicate ions. Tetrachlorosilane is mentioned as being of commercial importance since it can be hydrolyzed in the vapor phase to form amorphous fumed silica.

The article by Dr. Arkles shows how a substrate with hydroxyl groups on its surface can be reacted with a condensation product of an organosilane to provide chemical bonding to the substrate surface. The reactions are generally discussed and, with the exception of the formation of amorphous fumed silica, the reactions are between a liquid precursor and a substrate having hydroxyl groups on its surface. A number of different applications and potential applications are discussed.

In an article entitled "Organized Monolayers by Adsorption. 1. Formation and Structure of Oleophobic Mixed Monolayers on Solid Surfaces", published in the Journal of the American Chemical Society, Jan. 2, 1980, pp. 92-98, Jacob Sagiv discussed the possibility of producing oleophobic monolayers containing more than one component (mixed monolayers). The article is said to show that homogeneous mixed monolayers containing components which are very different in their properties and molecular shape may be easily formed on various solid polar substrates by adsorption from organic solutions. Irreversible adsorption is said to be achieved through covalent bonding of active silane molecules to the surface of the substrate.

Rivka Maoz et al., in an article entitled "Self-Assembling Monolayers In The Construction Of Planned Supramolecular Structures And As Modifiers Of Surface Properties", Journal de chimie physique, 1988, 85, no 11/12, describes organized monolayer structures prepared on polar solids via spontaneous adsorption from organic solutions. The monolayer structures are covalently bonded to the substrate, which is a solid surface.

In June of 1991, D. J. Ehrlich and J. Melngailis published an article entitled "Fast room-temperature growth of $SiO_2$ films by molecular-layer dosing" in Applied Physics Letters 58 (23), pp. 2675-2677. The authors describe a molecular-layer dosing technique for room-temperature growth of $\alpha$-$SiO_2$ thin films, which growth is based on the reaction of $H_2O$ and $SiCl_4$ adsorbates. The reaction is catalyzed by the hydrated $SiO_2$ growth surface, and requires a specific surface phase of hydrogen-bonded water. Thicknesses of the films is said to be controlled to molecular-layer precision; alternatively, fast conformal growth to rates exceeding 100 nm/min is said to be achieved by slight depression of the substrate temperature below room temperature. Potential applications such as trench filling for integrated circuits and hermetic ultrathin layers for multilayer photoresists are mentioned. Excimer-laser-induced surface modification is said to permit projection-patterned selective-area growth on silicon.

An article entitled "Atomic Layer Growth of $SiO_2$ on Si(100) Using The Sequential Deposition of $SiCl_4$ and $H_2O$" by Sneh et al. in Mat. Res. Soc. Symp. Proc. Vol 334, 1994, pp. 25-30, describes a study in which $SiO_2$ thin films were said to be deposited on Si(100) with atomic layer control at 600° K. ($\cong$327° C.) and at pressures in the range of 1 to 50 Torr using chemical vapor deposition (CVD).

In an article entitled "$SiO_2$ Chemical Vapor Deposition at Room Temperature Using $SiCl_4$ and $H_2O$ with an $NH_3$ Catalyst", by J. W. Klaus and S. M. George in the Journal of the Electrochemical Society, 147 (7) 2658-2664, 2000, the authors describe the deposition of silicon dioxide films at room temperature using a catalyzed chemical vapor deposition reaction. The $NH_3$ (ammonia) catalyst is said to lower the required temperature for $SiO_2$ CVD from greater than 900° K. to about 313-333° K.

Ashurst et al., in an article entitled "Dichlorodimethylsilane as an Anti-Stiction Monolayer for MEMS: A Comparison to the Octadecyltrichlorosilane Self-Assembled Monolayer", present a quantitative comparison of the dichlorodimethylsilane (DDMS) to the octadecyltrichlorosilane (OTS) self-assembled monolayer (SAM). The comparison is with respect to film properties of the films produced using these precursor materials and the effectiveness of the films as anti-stiction coatings for micromechanical structures. The coating deposition is carried out using iso-octane as the solvent from which the precursor molecules are deposited.

U.S. Pat. No. 5,328,768 to Goodwin, issued Jul. 12, 1994, discloses a method and article wherein a glass substrate is provided with a more durable non-wetting surface by treatment with a perfluoroalkyl alkyl silane and a fluorinated olefin telomer on a surface which comprises a silica primer layer. The silica primer layer is said to be preferably pyrolytically deposited, magnetron sputtered, or applied by a sol-gel condensation reaction (i.e., from alkyl silicates or chlorosilanes). A perfluoroalkyl alkyl silane combined with a fluorinated olefin telomer is said to produce a preferred surface treatment composition. The silane/olefin composition is employed as a solution, preferably in a fluorinated solvent. The solution is applied to a substrate surface by any conventional technique such as dipping, flowing, wiping, or spraying.

In U.S. Pat. No. 5,372,851, issued to Ogawa et al. on Dec. 13, 1995, a method of manufacturing a chemically adsorbed film is described. In particular a chemically adsorbed film is said to be formed on any type of substrate in a short time by chemically adsorbing a chlorosilane based surface active-agent in a gas phase on the surface of a substrate having active hydrogen groups. The basic reaction by which a chlorosilane is attached to a surface with hydroxyl groups present on the surface is basically the same as described in other articles discussed above. In a preferred embodiment, a chlorosilane based adsorbent or an alkoxyl-silane based adsorbent is used as the silane-based surface adsorbent, where the silane-based adsorbent has a reactive silyl group at one end and a condensation reaction is initiated in the gas phase atmosphere. A dehydrochlorination reaction or a de-alcohol reaction is carried out as the condensation reaction. After the dehydrochlorination reaction, the unreacted chlorosilane-based adsorbent on the surface of the substrate is washed with a non-aqueous solution and then the adsorbed material is reacted with aqueous solution to form a monomolecular adsorbed film.

U.S. patent Publication No. US 2002/0065663 A1, published on May 30, 2002, and titled "Highly Durable Hydrophobic Coatings And Methods", describes substrates which have a hydrophobic surface coating comprised of the reaction products of a chlorosilyl group containing compound and an alkylsilane. The substrate over which the coating is applied is preferably glass. In one embodiment, a silicon oxide anchor layer or hybrid organo-silicon oxide anchor layer is formed from a humidified reaction product of silicon tetrachloride or trichloromethylsilane vapors at atmospheric pressure. Application of the oxide anchor layer is, followed by the vapor-deposition of a chloroalkylsilane. The silicon oxide anchor layer is said to advantageously have a root mean square surface (nm) roughness of less than about 6.0 nm, preferably less than about 5.0 nm and a low haze value of less than about 3.0%. The RMS surface roughness of the silicon oxide layer is preferably said to be greater than about 4 nm, to improve adhesion. However, too great an RMS surface area is said to result in large surface peaks, widely spaced apart, which begins to diminish the desirable surface area for subsequent reaction with the chloroalkylsilane by vapor deposition. Too small an RMS surface is said to result in the surface, being too smooth, that is to say an insufficient increase in the surface area/or insufficient depth of the surface peaks and valleys on the surface.

Simultaneous vapor deposition of silicon tetrachloride and dimethyldichlorosilane onto a glass substrate is said to result in a hydrophobic coating comprised of cross-linked polydimethylsiloxane which may then be capped with a fluoroalkylsilane (to provide hydrophobicity). The substrate is said to be glass or a silicon oxide anchor layer deposited on a surface prior to deposition of the cross-linked polydimethylsiloxane. The substrates are cleaned thoroughly and rinsed prior to being placed in the reaction chamber.

U.S. patent Publication No. 2003/0180544 A1, published Sep. 25, 2003, and entitled "Anti-Reflective Hydrophobic Coatings and Methods, describes substrates having anti-reflective hydrophobic surface coatings. The coatings are typically deposited on a glass substrate. A silicon oxide anchor layer is formed from a humidified reaction product of silicon tetrachloride, followed by the vapor deposition of a chloroalkylsilane. The thickness of the anchor layer and the overlayer are said to be such that the coating exhibits light reflectance of less than about 1.5%. The coatings are said to be comprised of the reaction products of a vapor-deposited chlorosilyl group containing compound and a vapor-deposited alkylsilane.

U.S. Pat. No. 6,737,105, issued May 18, 2004 to David A. Richard, and entitled "Multilayered Hydrophobic Coating And Method Of Manufacturing The Same", describes a multi-layer coating for a transparent substrate, where the coating increases durability and weatherability of the substrate. The coating includes a surface-hardening layer of organo-siloxane formed over the substrate. An abrasion-resistant coating comprising a multi-layer stack of alternating layers of silicon dioxide and zirconium dioxide is formed over the surface-hardening layer. The multi-layer coating further includes a hydrophobic outer layer of perfluoroalkylsilane formed over the abrasion-resistant coating. The organo-silicon surface hardening layer is said to be sprayed, dipped, or centrifugally coated onto the substrate. The abrasion-resistant coating and the hydrophobic layer are said to be applied using any known dry coating technique, such as vacuum deposition or ion assisted deposition, with no process details provided.

Related references which pertain to coatings deposited on a substrate surface from a vapor include the following, as examples and not by way of limitation, U.S. Pat. No. 5,576,247 to Yano et al., issued Nov. 19, 1996, entitled: "Thin layer forming method where hydrophobic molecular layers preventing a BPSG layer from absorbing moisture". U.S. Pat. No. 5,602,671 of Hornbeck, issued Feb. 11, 1997, which describes low surface energy passivation layers for use in micromechanical devices. An article entitled "Vapor phase deposition of uniform and ultrathin silanes", by Yuchun Wang et al., SPIE Vol. 3258-0277-786X(98) 20-28, in which the authors describe uniform, conformal, and ultrathin coatings needed on the surface of biomedical microdevices such as microfabricated silicon filters, in order to regulate hydrophilicity and to minimize unspecific protein adsorption. Jian Wang et al., in an article published in Thin Solid Films 327-329 (1998) 591-594, entitled: "Gold nanoparticulate film bound to silicon surface with self-assembled monolayers", discuss a method for attaching gold nanoparticles to silicon surfaces with a self aligned monolayer (SAM) used for surface preparation".

Patrick W. Hoffmann et al., in an article published by the American Chemical Society, Langmuir 1997, 13, 1877-1880, describe the surface coverage and molecular orientation of monomolecular thin organic films on a Ge/Si oxide substrate. A gas phase reactor was said to have been used to provide precise control of substrate surface temperature and gas flow rates during deposition of monofunctional perfluorinated alkylsilanes. Complete processing conditions are not provided, and there is no description of the apparatus which was used to apply the thin films. T. M. Mayer et al. describe a "Chemical vapor deposition of fluoroalkylsilane monolayer films for adhesion control in microelectromechanical systems" in J. Vac. Sci. Technol. B 18(5), September/October 2000. This article mentions the use of a remotely generated microwave plasma for cleaning a silicon substrate surface prior to film deposition, where the plasma source gas is either water vapor or oxygen.

U.S. Pat. No. 6,576,489 to Leung et al., issued Jun. 10, 2003 describes methods of forming microstructure devices. The methods include the use of vapor-phase alkylsilane-containing molecules to form a coating over a substrate surface. The alkylsilane-containing molecules are introduced into a reaction chamber containing the substrate by bubbling an anhydrous, inert gas through a liquid source of the alkylsilane-containing molecules, and transporting the molecules with the carrier gas into the reaction chamber. The formation of the coating is carried out on a substrate surface at a temperature ranging between about 15° C. and 100° C., at a pressure in the reaction chamber which is said to be below atmospheric pressure, and yet sufficiently high for a suitable amount of alkylsilane-containing molecules to be present for expeditious formation of the coating.

Some of the various methods useful in applying layers and coatings to a substrate have been described above. There are numerous other patents and publications which relate to the deposition of functional coatings on substrates, but which appear to us to be more distantly related to the present invention. However, upon reading these informative descriptions, it becomes readily apparent that control of coating deposition on a molecular level is not addressed in adequate detail. When this is discussed, the process is typically described in generalized terms like those mentioned directly above, which terms are not enabling to one skilled in the art, but merely suggest experimentation. To provide a multilayered functional coating on a substrate surface which exhibits functional features on a nanometer scale, it is necessary to tailor the coating precisely. Without precise control of the deposition process, the coating may lack thickness uniformity and surface coverage, providing a rough surface. Or, the coating may vary in chemical composition across the surface of the substrate. Or, the coating may differ in structural composition across the surface of the substrate. Any one of these non-uniformities may result in functional discontinuities and defects on the coated substrate surface which are unacceptable for the intended application of the coated substrate.

U.S. patent application Ser. No. 10/759,857 of the present applicants describes processing apparatus which can provide specifically controlled, accurate delivery of precise quantities of reactants to the process chamber, as a means of improving control over a coating deposition process. The subject matter of the '857 application is hereby incorporated by reference in its entirety. The focus of the present application is the control of process conditions in the reaction chamber in a manner which, in combination with delivery of accurate quantities of reactive materials, provides a uniform, functional multilayered coating on a nanometer scale. The multilayered coating exhibits sufficient uniformity of thickness, chemical composition and structural composition over the substrate surface that such nanometer scale functionality is achieved. Further, particular multilayered structures provide an unexpected improvement in physical properties over coatings known in the art.

SUMMARY OF THE INVENTION

We have developed a series of multilayered coatings which are tailored to provide particular thickness, mechanical properties, and surface property characteristics. Preferably, but not by way of limitation, the multilayered coatings include sequentially applied layers which are applied using MOLECULAR VAPOR DEPOSITION™ (MVD) (Applied MicroStructures, Inc., San Jose, Calif.) techniques. The MVD deposition method is a vapor-phase deposition method which employs carefully controlled amounts of precursor reagents. Typically, a stagnation reaction from carefully controlled amounts of precursor reagents is employed in the formation of at least one layer of a multilayered coating. Stagnation deposition is accomplished by charging precise amounts of precursor reagents and permitting reaction of these precursors to form a reaction product, without the further addition of precursor during formation of the reaction product. In some instances, multiple stagnation depositions at spaced intervals may be used to produce an individual layer of a given composition.

It is possible to use other methods of vapor-phase deposition for coating layer application, such as a continuous gas flow technique of the kind which is known in the art, where our techniques for accurate control over amounts of precursor reagents are employed. In this instance, a carefully measured quantity of a volatile precursor, which has been accumulated in a precursor vapor reservoir, may be used to feed a continuous gas flow of a non-reactive carrier gas. In one embodiment, a multilayered coating deposition includes at least one stagnation deposition step, which is combined with at least one step in which a constantly flowing, non-reactive carrier gas is used to provide precursor reagents to a surface on which a layer is being formed. In some cases, a constantly flowing, non-reactive carrier gas may be used to increase the pressure in the processing chamber, to affect a reaction parameter at a substrate surface. (Apparatus configured for employment of a constantly flowing, non-reactive carrier gas is not shown in the figures attached hereto; however, one skilled in the art could add apparatus to provide this feature.)

A non-reactive carrier gas is a gas which does not take part in the precursor reactions which form the coating layer. Typically, a non-reactive carrier gas is a noble gas, such as, helium, argon, xenon, neon, or krypton (by way of example and not by way of limitation). In some instances, $N_2$ can be used as the carrier gas, when $N_2$ is not reactive with a precursor reagent or the substrate within the processing chamber.

The MVD deposition method is carried out using an apparatus which enables a stepped addition and mixing of all of the reactants to be consumed in a given process step, whether that process step is one in a series of steps or is the sole step in a coating formation process. In some instances, the coating formation process may include a number of individual steps where repetitive reactive processes are carried out in each individual step. The coating process may also include plasma treatment of the surface of one deposited layer prior to application of an overlying layer. Typically the plasma used for such treatment is a low density plasma. This plasma may be a remotely-generated plasma. The most important feature of the plasma treatment is that it is a "soft" plasma which affects the exposed surface enough to activate the surface of the layer being treated, but not enough to etch through the layer. The apparatus used to carry out the method provides for the addition of a precise amount of each of the reactants to be consumed in a single reaction step of the coating formation process. The apparatus may provide for precise addition of quantities of different combinations of reactants during each individual step when there are a series of different individual steps in the coating formation process. Some of the individual steps may be repetitive.

In addition to the control over the amount of reactants added to the process chamber, the present invention requires precise control over the cleanliness of the substrate, the order of reactant(s) introduction, the total pressure (which is typically less than atmospheric pressure) in the process chamber, the partial vapor pressure of each vaporous component present in the process chamber, the temperature of the substrate and chamber walls, and the amount of time that a given set of conditions is maintained. The control over this combination of variables determines the deposition rate and properties of the deposited layers. By varying these process parameters, we control the amount of the reactants available, the density of reaction sites, and the film growth rate, which is the result of the balance of the competitive adsorption and desorption processes on the substrate surface, as well as any gas phase reactions.

Typically, during deposition of a layer using stagnation deposition, the total pressure in the process chamber is lower than atmospheric pressure and the partial pressure of each vaporous component making up the reactive mixture is specifically controlled so that formation and attachment of molecules on a substrate surface are well controlled processes that can take place in a predictable manner.

The substrate surface concentration and location of reactive species are controlled using total pressure in the processing chamber, the kind and number of vaporous components present in the process chamber, and the partial pressure of each vaporous component in the chamber, for example. To obtain the planned reaction on the initial, uncoated substrate surface, the initial substrate surface has to be prepared so that the reactivity of the surface itself with the vaporous components present in the process chamber will be as expected. The treatment may be a wet chemical clean, but is preferably a plasma treatment. Typically treatment with an oxygen plasma removes common surface contaminants. In some instances, it is necessary not only to remove contaminants from the substrate surface, but also to generate —OH functional groups on the substrate surface (in instances where such —OH functional groups are not already present).

The surface properties of a multilayered structure may be controlled by the method of the invention. The hydrophobicity of a given substrate surface may be measured using a water droplet shape analysis method, for example. Silicon substrates, when treated with oxygen-containing plasmas, can be freed from organic contaminants and typically exhibit a water contact angle below 10°, indicative of a hydrophilic property of the treated substrate. In the case of more hydrophobic substrates, such as, for example, plastics or metals, the deposition or creation of an oxide-based layer or a nitride-based layer on the substrate surface may be used to alter the hydrophobicity of the substrate surface. An oxide layer is typically preferred due to the ease of creating an oxide layer. The oxide layer may comprise aluminum oxide, titanium oxide, or silicon oxide, by way of example and not by way of limitation. When the oxide layer is aluminum or titanium oxide, or when the layer is a nitride-based layer, an auxiliary process chamber (to the process chamber described herein) may be used to create this oxide layer or nitride layer. When the oxide layer is a silicon oxide layer, the silicon oxide layer may be applied by an embodiment method of the present invention which is described in detail herein, to provide a more hydrophilic substrate surface in the form of an oxide-based bonding layer comprising —OH functional groups. For example, an oxide surface prepared by the method can be used to adjust surface hydrophobicity downward to be as low as 5 degrees, rendering the surface hydrophilic.

Where it is desired to have a particularly uniform growth of the composition across the coating surface, or a variable composition across the thickness of a multilayered coating, more than one batch of reactants may be charged to the process chamber during formation of the coating.

The coatings formed by the method of the invention can be sufficiently controlled so that the surface roughness of the coating in terms of RMS is less than about 10 nm, and is typically in the range of about 0.5 nm to 5 nm.

One example of the application of the method described here is deposition of a multilayered coating including at least one oxide-based layer. The thickness of the oxide-based layer depends on the end-use application for the multilayered coating. However, the oxide-based layer is frequently deposited, using a series of stepped stagnation depositions, to have a final thickness ranging from about 5 Å to about 2000 Å. An oxide-based layer of this kind, or a series of oxide-based layers alternated with organic-based layers, may be used to increase the overall thickness of the multilayered coating (which typically derives the majority of its thickness from the oxide-based layer), and depending on the mechanical properties to be obtained, the oxide-based layer content of the multilayered coating may be increased when more coating rigidity and abrasion resistance is required.

The oxide-based layer is frequently used to provide a bonding surface for subsequently deposited various molecular organic-based coating layers. When the surface of the oxide-based layer is one containing —OH functional groups, the organic-based coating layer typically includes, for example and not by way of limitation, a silane-based functionality which permits covalent bonding of the organic-based coating layer to —OH functional groups present on the surface of the oxide-based layer. When the surface of the oxide-based layer is one capped with halogen functional groups, such as chlorine, by way of example and not by way of limitation, the organic-based coating layer includes, for example, an —OH functional group, which permits covalent bonding of the organic-based coating layer to the oxide-based layer functional halogen group.

By controlling the precise thickness, chemical, and structural composition of an oxide-based layer on a substrate, for example, we are able to direct the coverage and the functionality of a coating applied over the bonding oxide layer. The coverage and functionality of the coating can be controlled over the entire substrate surface on a nm scale. Specific, different thicknesses of an oxide-based substrate bonding layer are required on different substrates. Some substrates require an alternating series of oxide-based/organic-based layers to provide surface stability for a coating structure.

With respect to substrate surface properties, such as hydrophobicity or hydrophilicity, for example, a silicon wafer surface becomes hydrophilic, to provide a less than 5 degree water contact angle, after plasma treatment when there is some moisture present. Not much moisture is required, for example, typically the amount of moisture present after pumping a chamber from ambient air down to about 15 mTorr to 20 mTorr is sufficient moisture. A stainless steel surface requires formation of an overlying oxide-based layer having a thickness of about 30 Å or more to obtain the same degree of hydrophilicity as that obtained by plasma treatment of a silicon surface. Glass and polystyrene materials become hydrophilic, to a 5 degree water contact angle, after the application of about 80 Å or more of an oxide-based layer. An acrylic surface requires about 150 Å or more of an oxide-based layer to provide a 5 degree water contact angle.

There is also a required thickness of oxide-based layer to provide a good bonding surface for reaction with a subsequently applied organic-based layer. By a good bonding surface, it is meant a surface which provides full, uniform surface coverage of the organic-based layer. By way of example, about 80 Å or more of a oxide-based substrate bonding layer over a silicon wafer substrate provides a uniform hydrophobic contact angle, about 112 degrees, upon application of an organic-based layer deposited from an FDTS (perfluorodecyltrichlorosilanes) precursor. About 150 Å or more of oxide-based substrate bonding layer is required over a glass substrate or a polystyrene substrate to obtain a uniform coating having a similar contact angle. About 400 Å or more of oxide-based substrate bonding layer is required over an acrylic substrate to obtain a uniform coating having a similar contact angle.

The organic-based layer precursor, in addition to containing a functional group capable of reacting with the oxide-based layer to provide a covalent bond, may also contain a functional group at a location which will form the exterior surface of the attached organic-based layer. This functional-group may subsequently be reacted with other organic-based precursors, or may be the final layer of the coating and be used to provide surface properties of the coating, such as to render the surface hydrophobic or hydrophilic, by way of example and not by way of limitation. The functionality of an attached organic-based layer may be affected by the chemical composition of the previous organic-based layer (or the chemical composition of the initial substrate) if the thickness of the oxide layer separating the attached organic-based layer from the previous organic-based layer (or other substrate) is inadequate. The required oxide-based layer thickness is a function of the chemical composition of the substrate surface underlying the oxide-based layer, as illustrated above. In some instances, to provide structural stability for the surface layer of the coating, it is necessary to apply several alternating layers of an oxide-based layer and an organic-based layer.

With reference to chlorosilane-based coating systems of the kind described in the Background Art section of this application, where one end of the organic molecule presents chlorosilane, and the other end of the organic molecule presents a fluorine moiety, after attachment of the chlorosilane end of the organic molecule to the substrate, the fluorine moiety at the other end of the organic molecule provides a hydrophobic coating surface. Further, the degree of hydrophobicity and the uniformity of the hydrophobic surface at a given location across the coated surface may be controlled using the oxide-based layer which is applied over the substrate surface prior to application of the chlorosilane-comprising organic molecule. By controlling the oxide-based layer application, the organic-based layer is controlled indirectly. For example, using the process variables previously described, we are able to control the concentration of OH reactive species on the substrate surface. This, in turn, controls the density of reaction sites needed for subsequent deposition of a silane-based polymeric coating. Control of the substrate surface active site density enables uniform growth and application of high density self-aligned monolayer coatings (SAMS), for example.

We have discovered that it is possible to convert a hydrophilic-like substrate surface to a hydrophobic surface by application of an oxide-based layer of the minimal thickness described above with respect to a given substrate, followed by application of an organic-based layer over the oxide-based layer, where the organic-based layer provides hydrophobic surface functional groups on the end of the organic molecule which does not react with the oxide-based layer. However, when the initial substrate surface is a hydrophobic surface and it is desired to convert this surface to a hydrophilic surface, it is necessary to use a structure which comprises more than one oxide-based layer to obtain stability of the applied hydrophilic surface in water. It is not just the thickness of the oxide-based layer or the thickness of the organic-based layer which is controlling. The structural stability provided by a multilayered structure of repeated layers of oxide-based material interleaved with organic-based layers provides excellent results.

By controlling the total pressure in the vacuum processing chamber, the number and kind of vaporous components charged to the process chamber, the relative partial pressure of each vaporous component, the substrate temperature, the temperature of the process chamber walls, and the time over which particular conditions are maintained, the chemical reactivity and properties of the coating can be controlled. By controlling the process parameters, both density of film coverage over the substrate surface and structural composition over the substrate surface are more accurately controlled, enabling the formation of very smooth films, which typically range from about 0.1 nm to less than about 5 nm, and even more typically from about 1 nm to about 3 nm in surface RMS roughness. The thickness of smooth oxide bonding layer films typically ranges from about 0.5 nm to about 15 nm. These smooth films can be tailored in thickness, roughness, hydrophilicity, and density, which makes them particularly well suited for applications in the field of biotechnology and electronics and as bonding layers for various functional coatings in general.

After deposition of a first organic-based layer, and prior to the deposition of an overlying layer in a multilayered coating, it is advisable to use an in-situ oxygen plasma treatment. This treatment activates reaction sites of the first organic-based layer and may be used as part of a process for generating an oxide-based layer or simply to activate dangling bonds on the substrate surface. The activated dangling bonds may be exploited to provide reactive sites on the substrate surface. For example, an oxygen plasma treatment in combination with a controlled partial pressure of water vapor may be used to create a new concentration of OH reactive species on an exposed surface. The activated surface is then used to provide covalent bonding with the next layer of material applied. A deposition process may then be repeated, increasing the total coating thickness, and eventually providing a surface layer having the desired surface properties. In some instances, where the substrate surface includes metal atoms, treatment with the oxygen plasma and moisture provides a metal oxide-based layer containing —OH functional groups. This oxide-based layer is useful for increasing the overall thickness of the multilayered coating and for improving mechanical strength and rigidity of the multilayered coating.

By changing the total pressure in the process chamber and/or limiting the partial pressure of a reactive vaporous component so that the component is "starved" from the reactive substrate surface, the composition of the depositing coating can be "dialed in" to meet particular requirements.

A computer driven process control system may be used to provide for a series of additions of reactants to the process chamber in which the layer or coating is being formed. This process control system typically also controls other process variables, such as, (for example and not by way of limitation), total process chamber pressure (typically less than atmospheric pressure), substrate temperature, temperature of process chamber walls, temperature of the vapor delivery manifolds, processing time for given process steps, and other process parameters if needed.

BRIEF DESCRIPTION OF THE DRAWINGS

FIG. 3A shows the schematic for an AFM picture of a 4 nm thick silicon oxide bonding layer deposited from $SiCl_4$ precursor using the method of the present invention, where the RMS roughness is about 1.4 nm.

FIG. 3B shows the schematic for an AFM picture of a 30 nm thick silicon oxide bonding layer deposited from $SiCl_4$ precursor using the method of the present invention, where the RMS roughness is about 4.2 nm.

FIG. 11A shows data for a silicon substrate surface.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise. The term "about", as used herein, refers to a value or range which may encompass plus or minus 10% of a particular cited value or range.

As a basis for understanding the invention, it is necessary to discuss the processing apparatus which permits precise control over the addition of coating precursors and other vaporous components present within the reaction/processing chamber in which the coating is applied. The apparatus described below is not the only apparatus in which the present invention may be practiced, it is merely an example of one apparatus which may be used. One skilled in the art will recognize equivalent elements in other forms which may be substituted and still provide an acceptable processing system.

I. An Apparatus for Vapor Depositions of Thin Coatings

Figure 1:
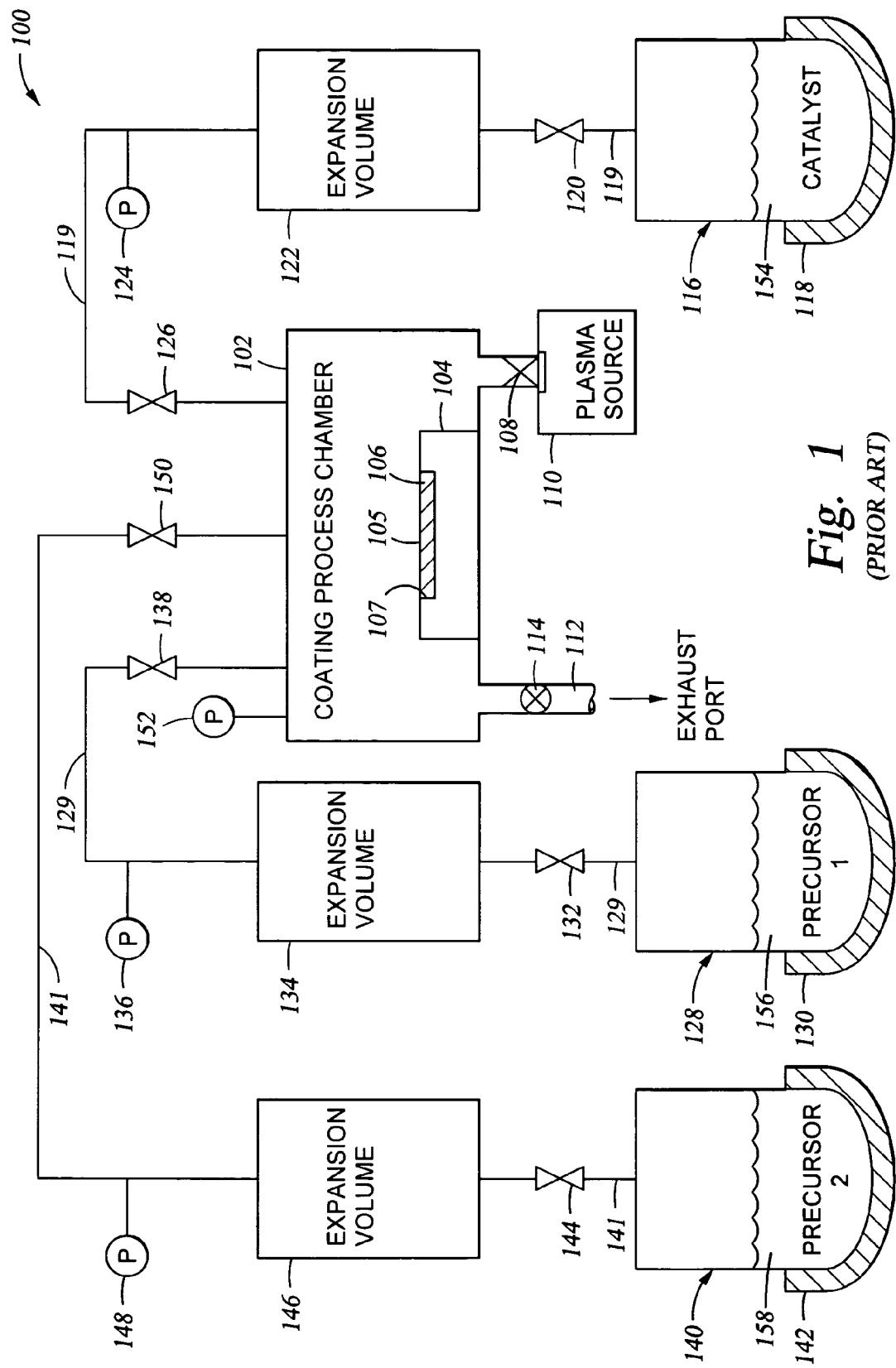
FIG. 1 shows a cross-sectional schematic of one embodiment of the kind of an apparatus which can be used to carry out a vapor deposition of a coating in accordance with the method of the present invention.

FIG. 1 shows a cross-sectional schematic of an apparatus 100 for vapor deposition of thin coatings. The apparatus 100 includes a process chamber 102 in which thin (typically 0.5 nm to 50 nm thick) coatings are vapor deposited. A substrate 106 to be coated rests upon a temperature controlled substrate holder 104, typically within a recess 107 in the substrate holder 104.

Depending on the chamber design, the substrate 106 may rest on the chamber bottom (not shown in this position in FIG. 1). Attached to process chamber 102 is a remote plasma source 110, connected via a valve 108. Remote plasma source 110 may be used to provide a plasma which is used to clean and/or convert a substrate surface to a particular chemical state prior to application of a coating (which enables reaction of coating species and/or catalyst with the surface, thus improving adhesion and/or formation of the coating); or may be used to provide species helpful during formation of the coating (not shown) or modifications of the coating after deposition. The plasma may be generated using a microwave, DC, or inductive RF power source, or combinations thereof. The process chamber 102 makes use of an exhaust port 112 for the removal of reaction byproducts and is opened for pumping/purging the chamber 102. A shut-off valve or a control valve 114 is used to isolate the chamber or to control the amount of vacuum applied to the exhaust port. The vacuum source is not shown in FIG. 1.

The apparatus 100 shown in FIG. 1 is illustrative of a vapor deposited coating which employs two precursor materials and a catalyst. One skilled in the art will understand that one or more precursors and from zero to multiple catalysts may be used during vapor deposition of a coating. A catalyst storage container 116 contains catalyst 154, which may be heated using heater 118 to provide a vapor, as necessary. It is understood that precursor and catalyst storage container walls, and transfer lines into process chamber 102 will be heated as necessary to maintain a precursor or catalyst in a vaporous state, minimizing or avoiding condensation. The same is true with respect to heating of the interior surfaces of process chamber 102 and the surface of substrate 106 to which the coating (not shown) is applied. A control valve 120 is present on transfer line 119 between catalyst storage container 116 and catalyst vapor reservoir 122, where the catalyst vapor is permitted to accumulate until a nominal, specified pressure is measured at pressure indicator 124. Control valve 120 is in a normally-closed position and returns to that position once the specified pressure is reached in catalyst vapor reservoir 122. At the time the catalyst vapor in vapor reservoir 122 is to be released, valve 126 on transfer line 119 is opened to permit entrance of the catalyst present in vapor reservoir 122 into process chamber 102 which is at a lower pressure. Control valves 120 and 126 are controlled by a programmable process control system of the kind known in the art (which is not shown in FIG. 1).

A Precursor 1 storage container 128 contains coating reactant Precursor 1, which may be heated using heater 130 to provide a vapor, as necessary. As previously mentioned, Precursor 1 transfer line 129 and vapor reservoir 134 internal surfaces are heated as necessary to maintain a Precursor 1 in a vaporous state, minimizing and preferably avoiding condensation. A control valve 132 is present on transfer line 129 between Precursor 1 storage container 128 and Precursor 1 vapor reservoir 134, where the Precursor 1 vapor is permitted to accumulate until a nominal, specified pressure is measured at pressure indicator 136. Control valve 132 is in a normally-closed position and returns to that position once the specified pressure is reached in Precursor 1 vapor reservoir 134. At the time the Precursor 1 vapor in vapor reservoir 134 is to be released, valve 138 on transfer line 129 is opened to permit entrance of the Precursor 1 vapor present in vapor reservoir 134 into process chamber 102, which is at a lower pressure. Control valves 132 and 138 are controlled by a programmable process control system of the kind known in the art (which is not shown in FIG. 1).

A Precursor 2 storage container 140 contains coating reactant Precursor 2, which may be heated using heater 142 to provide a vapor, as necessary. As previously mentioned, Precursor 2 transfer line 141 and vapor reservoir 146 internal surfaces are heated as necessary to maintain Precursor 2 in a vaporous state, minimizing, and preferably avoiding condensation. A control valve 144 is present on transfer line 141 between Precursor 2 storage container 146 and Precursor 2 vapor reservoir 146, where the Precursor 2 vapor is permitted to accumulate until a nominal, specified pressure is measured at pressure indicator 148. Control valve 141 is in a normally-closed position and returns to that position once the specified pressure is reached in Precursor 2 vapor reservoir 146. At the time the Precursor 2 vapor in vapor reservoir 146 is to be released, valve 150 on transfer line 141 is opened to permit entrance of the Precursor 2 vapor present in vapor reservoir 146 into process chamber 102, which is at a lower pressure. Control valves 144 and 150 are controlled by a programmable process control system of the kind known in the art (which is not shown in FIG. 1).

During formation of a coating (not shown) on a surface 105 of substrate 106, at least one incremental addition of vapor equal to the vapor reservoir 122 of the catalyst 154, and the vapor reservoir 134 of the Precursor 1, or the vapor reservoir 146 of Precursor 2 may be added to process chamber 102. The total amount of vapor added is controlled by both the adjustable volume size of each of the expansion chambers (typically 50 cc up to 1,000 cc) and the number of vapor injections (doses) into the reaction chamber. Further, the set pressure 124 for catalyst vapor reservoir 122, or the set pressure 136 for Precursor 1 vapor reservoir 134, or the set pressure 148 for Precursor 2 vapor reservoir 146, may be adjusted to control the amount (partial vapor pressure) of the catalyst or reactant added to any particular step during the coating formation process. This ability to control precise amounts of catalyst and vaporous precursors to be dosed (charged) to the process chamber 102 at a specified time provides not only accurate dosing of reactants and catalysts, but repeatability in the vapor charging sequence.

This apparatus provides a relatively inexpensive, yet accurate method of adding vapor phase precursor reactants and catalyst to the coating formation process, despite the fact that many of the precursors and catalysts are typically relatively non-volatile materials. In the past, flow controllers were used to control the addition of various reactants; however, these flow controllers may not be able to handle some of the precursors used for vapor deposition of coatings, due to the low vapor pressure and chemical nature of the precursor materials. The rate at which vapor is generated from some of the precursors is generally too slow to function with a flow controller in a manner which provides availability of material in a timely manner for the vapor deposition process.

The apparatus discussed above allows for accumulation of the specific quantity of vapor in the vapor reservoir which can be charged (dosed) to the reaction. In the event it is desired to make several doses during the coating process, the apparatus can be programmed to do so, as described above. Additionally, adding of the reactant vapors into the reaction chamber in controlled aliquots (as opposed to continuous flow) greatly reduces the amount of the reactants used and the cost of the coating.

One skilled in the art of chemical processing of a number of substrates simultaneously will recognize that a processing system which permits heat and mass transfer uniformly over a number of substrate surfaces simultaneously may be used to carry out the present invention.

II. Exemplary Embodiments of the Method of the Invention

A method of the invention provides for vapor-phase deposition of coatings, where a processing chamber of the kind, or similar to the processing chamber described above is employed. Each coating precursor is transferred in vaporous form to a precursor vapor reservoir in which the precursor vapor accumulates. A nominal amount of the precursor vapor, which is the amount required for a coating layer deposition is accumulated in the precursor vapor reservoir. The at least one coating precursor is charged from the precursor vapor reservoir into the processing chamber in which a substrate to be coated resides. In some instances, at least one catalyst vapor is added to the process chamber in addition to the at least one precursor vapor, where the relative quantities of catalyst and precursor vapors are based on the physical characteristics to be exhibited by the coating. In some instances a diluent gas is added to the process chamber in addition to the at least one precursor vapor (and optional catalyst vapor). The diluent gas is chemically inert and is used to increase a total desired processing pressure, while the partial pressure amounts of coating precursors and optionally catalyst components are varied.

The example embodiments described below are with reference to the bonding oxide and the silane-based polymeric coating systems of the kind mentioned above. However, it is readily apparent to one of skill in the art that the concepts involved can be applied to additional coating compositions and combinations which have different functionalities.

Due to the need to control the degree and scale of functionality of the coating at dimensions as small as nanometers, the surface preparation of the substrate prior to application of the coating is very important. One method of preparing the substrate surface is to expose the surface to a uniform, non-physically-bombarding plasma which is typically created from a plasma source gas containing oxygen. The plasma may be a remotely generated plasma which is fed into a processing chamber in which a substrate to be coated resides. Depending on the coating to be applied directly over the substrate, the plasma treatment of the substrate surface may be carried out in the chamber in which the coating is to be applied. This has the advantage that the substrate is easily maintained in a controlled environment between the time that the surface is treated and the time at which the coating is applied. Alternatively, it is possible to use a large system which includes several processing chambers and a centralized transfer chamber which allows substrate transfer from one chamber to another via a robot handling device, where the centralized handling chamber as well as the individual processing chambers are each under a controlled environment.

When a silicon oxide layer is applied to the substrate surface to provide a substrate surface having a controlled hydrophobicity (a controlled availability of reactive hydroxylated sites), the oxide layer may be created using the well-known catalytic hydrolysis of a chlorosilane, such as a tetrachlorosilane, in the manner previously described. A subsequent attachment of an organo-chlorosilane, which may or may not include a functional moiety, may be used to impart a particular function to the finished coating. By way of example and not by way of limitation, the hydrophobicity or hydrophilicity of the coating surface may be altered by the functional moiety present on a surface of the organo-chlorosilane which becomes an exterior surface of the coating.

As previously mentioned, the layer used as an adhering layer in contact with the substrate surface or in contact with an activated organic-based layer may be an oxide-based layer or a nitride-based layer. An oxide-based layer is described here because to ease of application in the apparatus described herein. Application of a nitride-based layer typically requires an auxiliary processing chamber designed for application of a nitride-based layer, using techniques which are generally known in the art. An oxide-based layer, which may be a silicon oxide or another oxide, may be formed using the method of the present invention by vapor phase hydrolysis of the chlorosilane, with subsequent attachment of the hydrolyzed silane to the substrate surface. Alternatively, the hydrolysis reaction may take place directly on the surface of the substrate, where moisture has been made available on the substrate surface to allow simultaneous hydrolyzation and attachment of the chlorosilane to the substrate surface. The hydrolysis in the vapor phase using relatively wide range of partial pressure of the silicon tetrachloride precursor in combination with a partial pressure in the range of 10 Torr or greater of water vapor will generally result in rougher surfaces on the order of 5 nm RMS or greater, where the thickness of the film formed will typically be in the range of about 15 nm or greater.

Multi-layer films where at least two oxide-based layers and at least two organic-based layers are present, typically have a film thickness ranging from about 7 nm (70 Å) to about 1 µm.

A thin film of an oxide-based layer, prepared on a silicon substrate, where the oxide-based layer exhibits a thickness ranging from about 2 nm to about 15 nm, typically exhibits a 1-5 nm RMS finish. These films are grown by carefully balancing the vapor and surface hydrolysis reaction components.

For example, and not by way of limitation, we have obtained films having a 1-5 nm RMS finish in an apparatus of the kind previously described, where the partial pressure of the silicon tetrachloride is in the range of about 0.5 Torr to about 100 Torr (more typically in the range of about 0.5 Torr to about 30 Torr); the partial pressure of the water vapor is in the range of about 0.5 Torr to about 300 Torr (more typically in the range of about 0.5 Torr to about 15 Torr); and, where the total process chamber pressure ranges from about 0.5 Torr to about 400 Torr (more typically in the range of about 0.5 Torr to about 30 Torr). The substrate temperature ranges from about 10° C. to about 130° C. (more typically in the range of about 15° C. to about 80° C.), where the process chamber walls are at a temperature ranging from about 20° C. to about 150° C. (more typically within the range of about 20° C. to about 100° C.). The time period over which the substrate is exposed to the combination of silicon tetrachloride and water vapor ranges from about 2 minutes to about 12 minutes. A preferred embodiment deposition process is described in more detail subsequently herein, with reference to FIGS. 6A through 6C.

Example One

Deposition of a Silicon Oxide Layer Having a Controlled Number of OH Reactive Sites Available on the Oxide Layer Surface A technique for adjusting the hydrophobicity/hydrophilicity of a substrate surface (so that the surface is converted from hydrophobic to hydrophilic or so that a hydrophilic surface is made more hydrophilic, for example) may also be viewed as adjusting the number of OH reactive sites available on the surface of the substrate. One such technique is to apply an oxide coating over the substrate surface while providing the desired concentration of OH reactive sites available on the oxide surface. A schematic 200 of the mechanism of oxide formation in shown in FIG. 2. In particular, a substrate 202 has OH groups 204 present on the substrate surface 203. A chlorosilane 208, such as the tetrachlorosilane shown, and water 206 are reacted with the OH groups 204, either simultaneously or in sequence, to produce the oxide layer 208 shown on surface 203 of substrate 202 and byproduct HCl 210. In addition to chlorosilane precursors, chlorosiloxanes, fluorosilanes, and fluorosiloxanes may be used.

Figure 2:
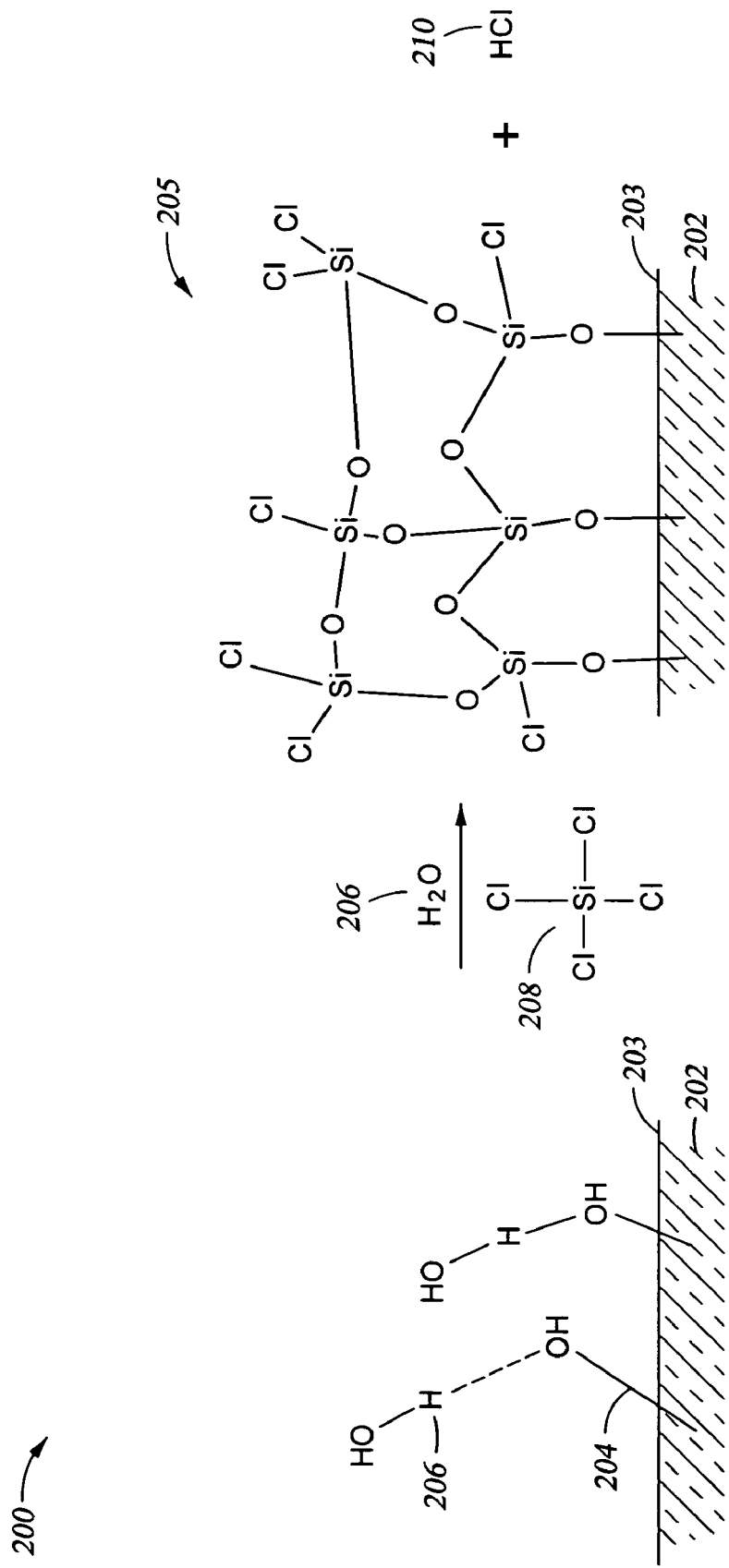
FIG. 2 is a schematic which shows the reaction mechanism where tetrachlorosilane and water are reacted with a substrate which exhibits active hydroxyl groups on the substrate surface, to form a silicon oxide layer on the surface of the substrate.

Subsequent to the reaction shown in FIG. 2, the surface of the oxide layer 208 can be further reacted with water to replace Cl atoms on the upper surface of oxide layer 208 with H atoms, to create new OH groups (not shown). By controlling the amount of water used in both reactions, the frequency of OH reactive sites available on the oxide surface is controlled.

Example Two

In the preferred embodiment discussed below, a silicon oxide coating was applied over a glass substrate. The glass substrate was treated with an oxygen plasma in the presence of residual moisture which was present in the process chamber (after pump down of the chamber to about 20 mTorr) to provide a clean surface (free from organic contaminants) and to provide the initial OH groups on the glass surface.

Various process conditions for the subsequent reaction of the OH groups on the glass surface with vaporous tetrachlorosilane and water are provided below in Table I, along with data related to the thickness and roughness of the oxide coating obtained and the contact angle (indicating hydrophobicity/hydrophilicity) obtained under the respective process conditions. A lower contact angle indicates increased hydrophilicity and an increase in the number of available OH groups on the silicon oxide surface.

TABLE I

Deposition of a Silicon Oxide Layer of Varying Hydrophilicity

| Run No. | Order of Dosing | Partial Pressure SiCl$_4$ Vapor (Torr) | Partial Pressure H$_2$O Vapor (Torr) | Reaction Time (min.) | Coating Thickness (nm) | Coating Roughness (RMS, nm)* | SiO$_2$ Contact Angle*** (°) |
|---|---|---|---|---|---|---|---|
| 1 | First[2] SiCl$_4$ | 0.8 | 4.0 | 10 | 3 | 1 | <5 |
| 2 | First[1] H$_2$O | 4.0 | 10.0 | 10 | 35 | 5 | <5 |
| 3 | First[2] SiCl$_4$ | 4.0 | 10.0 | 10 | 30 | 4 | <5 |

| Run No. | Order of Dosing | Partial Pressure FOTS Vapor (Torr) | Partial Pressure H$_2$O Vapor (Torr) | Reaction Time (min.) | Coating Thickness (nm)** | Coating Roughness (RMS, nm)* | FOTS Surface Contact Angle*** (°) |
|---|---|---|---|---|---|---|---|
| 1 | First[3] FOTS | 0.2 | 0.8 | 15 | 4 | 1 | 108 |
| 2 | First[3] FOTS | 0.2 | 0.8 | 15 | 36 | 5 | 109 |
| 3 | First[3] FOTS | 0.2 | 0.8 | 15 | 31 | 4 | 109 |

*Coating roughness is the RMS roughness measured by AFM (atomic force microscopy).
**The FOTS coating layer was a monolayer which added ≈1 nm in thickness.
***Contact angles were measured with 18 MΩ D.I. water.
[1]The H$_2$O was added to the process chamber 10 seconds before the SiCl$_4$ was added to the process chamber.
[2]The SiCl$_4$ was added to the process chamber 10 seconds before the H$_2$O was added to the process chamber.
[3]The FOTS was added to the process chamber 5 seconds before the H$_2$O was added to the process chamber.
[4]The substrate temperature and the chamber wall temperature were each 35° C. for both application of the SiO$_2$ bonding/bonding layer and for application of the FOTS organosilane overlying monolayer (SAM) layer.

We have discovered that very different film thicknesses and film surface roughness characteristics can be obtained as a function of the partial pressures of the precursors, despite the maintenance of the same time period of exposure to the precursors. Table II below illustrates this unexpected result.

TABLE II

Response Surface Design* Silicon Oxide Layer Deposition

| Run No. | Total Pressure (Torr) | Partial Pressure SiCl$_4$ Vapor (Torr) | Partial Pressure H$_2$O Vapor (Torr) | Substrate and Chamber Wall Temp. (° C.) | Reaction Time (min.) | Coating Thickness (nm) | Coating Surface Roughness RMS (nm) |
|---|---|---|---|---|---|---|---|
| 1 | 9.4 | 2.4 | 7 | 35 | 7 | 8.8 | NA |
| 2 | 4.8 | 0.8 | 4 | 35 | 7 | 2.4 | 1.29 |
| 3 | 6.4 | 2.4 | 4 | 35 | 4 | 3.8 | 1.39 |
| 4 | 14.0 | 4.0 | 10 | 35 | 7 | 21.9 | NA |
| 5 | 7.8 | 0.8 | 7 | 35 | 4 | 4.0 | 2.26 |
| 6 | 11.0 | 4.0 | 7 | 35 | 10 | 9.7 | NA |
| 7 | 11.0 | 4.0 | 7 | 35 | 4 | 10.5 | NA |
| 8 | 12.4 | 2.4 | 10 | 35 | 4 | 14.0 | NA |
| 9 | 6.4 | 2.4 | 4 | 35 | 10 | 4.4 | 1.39 |
| 10 | 9.4 | 2.4 | 7 | 35 | 7 | 8.7 | NA |
| 11 | 12.4 | 2.4 | 10 | 35 | 10 | 18.7 | NA |
| 12 | 9.4 | 2.4 | 7 | 35 | 7 | 9.5 | NA |
| 13 | 8.0 | 4.8 | 4 | 35 | 7 | 6.2 | 2.16 |
| 14 | 10.8 | 0.8 | 10 | 35 | 7 | 6.9 | NA |
| 15 | 7.8 | 0.8 | 7 | 35 | 10 | 4.4 | 2.24 |

*(Box-Behnken) 3 Factors, 3 Center Points
NA = Not Available, Not Measured

In addition to the tetrachlorosilane described above as a precursor for oxide formation, other chlorosilane precursors such a trichlorosilanes, dichlorosilanes work well as a precursor for oxide formation. Examples of specific advantageous precursors include hexachlorodisilane ($Si_2Cl_6$) and hexachlorodisiloxane ($Si_2Cl_6O$). As previously mentioned, in addition to chlorosilanes, chlorosiloxanes, fluorosilanes, and fluorosiloxanes may also be used as precursors.

Similarly, the vapor deposited silicon oxide coating from the $SiCl_4$ and $H_2O$ precursors was applied over glass, polycarbonate, acrylic, polyethylene and other plastic materials using the same process conditions as those described above with reference to the silicon substrate. Prior to application of the silicon oxide coating, the surface to be coated was treated with an oxygen plasma.

A silicon oxide coating of the kind described above can be applied over a self aligned monolayer (SAM) coating formed from an organic precursor, for example and not by way of limitation from fluoro-tetrahydrooctyldimethylchlorosilane (FOTS). Prior to application of the silicon oxide coating, the surface of the SAM should be treated with an oxygen plasma. A FOTS coating surface requires a plasma treatment of about 10-30 seconds to enable adhesion of the silicon oxide coating. The plasma treatment creates reactive OH sites on the surface of the SAM layer, which sites can subsequently be reacted with $SiCl_4$ and water precursors, as illustrated in FIG. 2, to create a silicon oxide coating. This approach allows for deposition of multilayered molecular coatings, where all of the layers may be the same, or some of the layers may be different, to provide particular performance capabilities for the multilayered coating.

Functional properties designed to meet the end use application of the finalized product can be tailored by either sequentially adding an organo-silane precursor to the oxide coating precursors or by using an organo-silane precursor(s) for formation of the last, top layer coating. Organo-silane precursor materials may include functional groups such that the silane precursor includes an alkyl group, an alkoxyl group, an alkyl substituted group containing fluorine, an alkoxyl substituted group containing fluorine, a vinyl group, an ethynyl group, or a glycol substituted group containing a silicon atom or an oxygen atom, by way of example and not by way of limitation. In particular, organic-containing precursor materials such as (and not by way of limitation) silanes, chlorosilanes, fluorosilanes, methoxy silanes, alkyl silanes, amino silanes, epoxy silanes, glycoxy silanes, and acrylosilanes are useful in general.

Some of the particular precursors used to produce coatings are, by way of example and not by way of limitation, perfluorodecyltrichlorosilanes (FDTS), undecenyltrichlorosilanes (UTS), vinyl-trichlorosilanes (VTS), decyltrichlorosilanes (DTS), octadecyltrichlorosilanes (OTS), dimethyldichlorosilanes (DDMS), dodecenyltricholrosilanes (DDTS), fluoro-tetrahydrooctyldimethylchlorosilanes (FOTS), perfluorooctyldimethylchlorosilanes, aminopropylmethoxysilanes (APTMS), fluoropropylmethyldichlorosilanes, and perfluorodecyldimethylchlorosilanes. The OTS, DTS, UTS, VTS, DDTS, FOTS, and FDTS are all trichlorosilane precursors. The other end of the precursor chain is a saturated hydrocarbon with respect to OTS, DTS, and UTS; contains a vinyl functional group, with respect to VTS and DDTS; and contains fluorine atoms with respect to FDTS (which also has fluorine atoms along the majority of the chain length). Other useful precursors include 3-aminopropyltrimethoxysilane (APTMS), which provides amino functionality, and 3-glycidoxypropyltrimethoxysilane (GPTMS). One skilled in the art of organic chemistry can see that the vapor deposited coatings from these precursors can be tailored to provide particular functional characteristics for a coated surface.

Most of the silane-based precursors, such as commonly used di- and tri-chlorosilanes, for example and not by way of limitation, tend to create agglomerates on the surface of the substrate during the coating formation. These agglomerates can cause structure malfunctioning or stiction. Such agglomerations are produced by partial hydrolysis and polycondensation of the polychlorosilanes. This agglomeration can be prevented by precise metering of moisture in the process ambient which is a source of the hydrolysis, and by carefully controlled metering of the availability of the chlorosilane precursors to the coating formation process. The carefully metered amounts of material and careful temperature control of the substrate and the process chamber walls can provide the partial vapor pressure and condensation surfaces necessary to control formation of the coating on the surface of the substrate rather than promoting undesired reactions in the vapor phase or on the process chamber walls.

Example Three

When the oxide-forming silane and the organo-silane which includes the functional moiety are deposited simultaneously (co-deposited), the reaction may be so rapid that the sequence of precursor addition to the process chamber becomes critical. For example, in a co-deposition process of $SiCl_4$/FOTS/$H_2O$, if the FOTS is introduced first, it deposits on the glass substrate surface very rapidly in the form of islands, preventing the deposition of a homogeneous composite film. Examples of this are provided in Table III, below.

When the oxide-forming silane is applied to the substrate surface first, to form the oxide layer with a controlled density of potential OH reactive sites available on the surface, the subsequent reaction of the oxide surface with a FOTS precursor provides a uniform film without the presence of agglomerated islands of polymeric material, examples of this are provided in Table III below.

TABLE III

Deposition of a Coating Upon a Silicon Substrate*
Using Silicon tetrachloride and FOTS Precursors

| Run No. | | Total Pressure (Torr) | Partial Pressure $SiCl_4$ Vapor (Torr) | Partial Pressure FOTS Vapor (Torr) | Partial Pressure $H_2O$ Vapor (Torr) | Substrate and Chamber Wall Temp. (° C.) |
|---|---|---|---|---|---|---|
| 1 | FOTS + $H_2O$ | 1 | — | 0.20 | 0.80 | 35 |
| 2 | $H_2O$ + $SiCl_4$ followed by FOTS + $H_2O$ | 14 | 4 | — | 10 | 35 |
|   |   | 1 | — | 0.20 | 0.80 | 35 |

TABLE III-continued

Deposition of a Coating Upon a Silicon Substrate*
Using Silicon tetrachloride and FOTS Precursors

| | | | | | | |
|---|---|---|---|---|---|---|
| 3 | FOTS + SiCl$_4$ + H$_2$O | 14.2 | 4 | 0.20 | 10 | 35 |
| 4 | SiCl$_4$ + H$_2$O | 14 | 4 | — | 10 | 35 |
| 5 | SiCl$_4$ + H$_2$O | 5.8 | 0.8 | — | 5 | 35 |
| 6 | SiCl$_4$ + H$_2$O repeated twice | 14 | 4 | — | 10 | 35 |

| | Reaction Time (min.) | Coating Thickness (nm) | Coating Roughness (nm)** RMS | Contact Angle*** (°) |
|---|---|---|---|---|
| 1 | 15 | 0.7 | 0.1 | 110 |
| 2 | 10 + 15 | 35.5 | 4.8 | 110 |
| 3 | 15 | 1.5 | 0.8 | 110 |
| 4 | 10 | 30 | 0.9 | <5 |
| 5 | 10 | 4 | 0.8 | <5 |
| 6 | 10 + 10 | 55 | 1.0 | <5 |

*The silicon substrates used to prepare experimental samples described herein exhibited an initial surface RMS roughness in the range of about 0.1 nm, as measured by Atomic Force Microscope (AFM).
**Coating roughness is the RMS roughness measured by AFM.
***Contact angles were measured with 18 MΩ D.I. water.

An example process description for Run No. 2 was as follows.

Step 1. Pump down the reactor and purge out the residual air and moisture to a final baseline pressure of about 30 mTorr or less.

Step 2. Perform O$_2$ plasma clean of the substrate surface to eliminate residual surface contamination and to oxygenate/hydroxylate the substrate. The cleaning plasma is an oxygen-containing plasma. Typically the plasma source is a remote plasma source, which may employ an inductive power source. However, other plasma generation apparatus may be used. In any case, the plasma treatment of the substrate is typically carried out in the coating application process chamber. The plasma density/efficiency should be adequate to provide a substrate surface after plasma treatment which exhibits a contact angle of about 10° or less when measured with 18 MΩ D.I. water. The coating chamber pressure during plasma treatment of the substrate surface in the coating chamber was 0.5 Torr, and the duration of substrate exposure to the plasma was 5 minutes.

Step 3. Inject SiCl$_4$ and within 10 seconds inject water vapor at a specific partial pressure ratio to the SiCl$_4$, to form a silicon oxide base layer on the substrate. For example, for the glass substrate discussed in Table III, 1 volume (300 cc at 100 Torr) of SiCl$_4$ to a partial pressure of 4 Torr was injected, then, within 10 seconds 10 volumes (300 cc at 17 Torr each) of water vapor were injected to produce a partial pressure of 10 Torr in the process chamber, so that the volumetric pressure ratio of water vapor to silicon tetrachloride is about 2.5. The substrate was exposed to this gas mixture for 1 min to 15 minutes, typically for about 10 minutes. The substrate temperature in the examples described above was in the range of about 35° C. Substrate temperature may be in the range from about 20° C. to about 80° C. The process chamber surfaces were also in the range of about 35° C.

Step 4. Evacuate the reactor to <30 mTorr to remove the reactants.

Step 5. Introduce the chlorosilane precursor and water vapor to form a hydrophobic coating. In the example in Table III, FOTS vapor was injected first to the charging reservoir, and then into the coating process chamber, to provide a FOTS partial pressure of 200 mTorr in the process chamber, then, within 10 seconds, H$_2$O vapor (300 cc at 12 Torr) was injected to provide a partial pressure of about 800 mTorr, so that the total reaction pressure in the chamber was 1 Torr. The substrate was exposed to this mixture for 5 to 30 minutes, typically 15 minutes, where the substrate temperature was about 35° C. Again, the process chamber surface was also at about 35° C.

An example process description for Run No. 3 was as follows.

Step 1. Pump down the reactor and purge out the residual air and moisture to a final baseline pressure of about 30 mTorr or less.

Step 2. Perform remote O$_2$ plasma clean to eliminate residual surface contamination and to oxygenate/hydroxylate the glass substrate. Process conditions for the plasma treatment were the same as described above with reference to Run No. 2.

Step 3. Inject FOTS into the coating process chamber to produce a 200 mTorr partial pressure in the process chamber. Then, inject 1 volume (300 cc at 100 Torr) of SiCl$_4$ from a vapor reservoir into the coating process chamber, to a partial pressure of 4 Torr in the process chamber. Then, within 10 seconds inject 10 volumes (300 cc at 17 Torr each) of water vapor from a vapor reservoir into the coating process chamber, to a partial pressure of 10 Torr in the coating process chamber. Total pressure in the process chamber is then about 14 Torr. The substrate temperature was in the range of about 35° C. for the specific examples described, but could range from about 15° C. to about 80° C. The substrate was exposed to this three gas mixture for about 1-15 minutes, typically about 10 minutes.

Step 4. Evacuate the process chamber to a pressure of about 30 mTorr to remove excess reactants.

Example Four

Figure 3A:
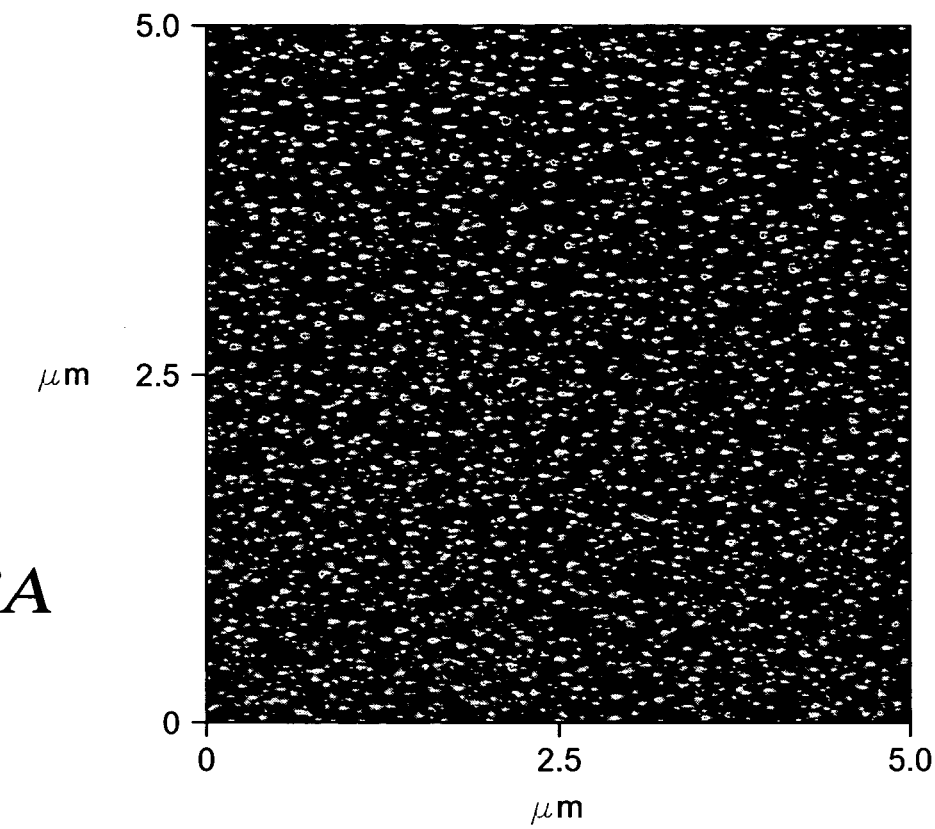
FIGS. 3A and 3B show schematics of atomic force microscope (AFM) images of silicon oxide bonding layers deposited on a silicon substrate. The initial silicon substrate surface RMS roughness measured less than about 0.1 nm.
Figure 3B:
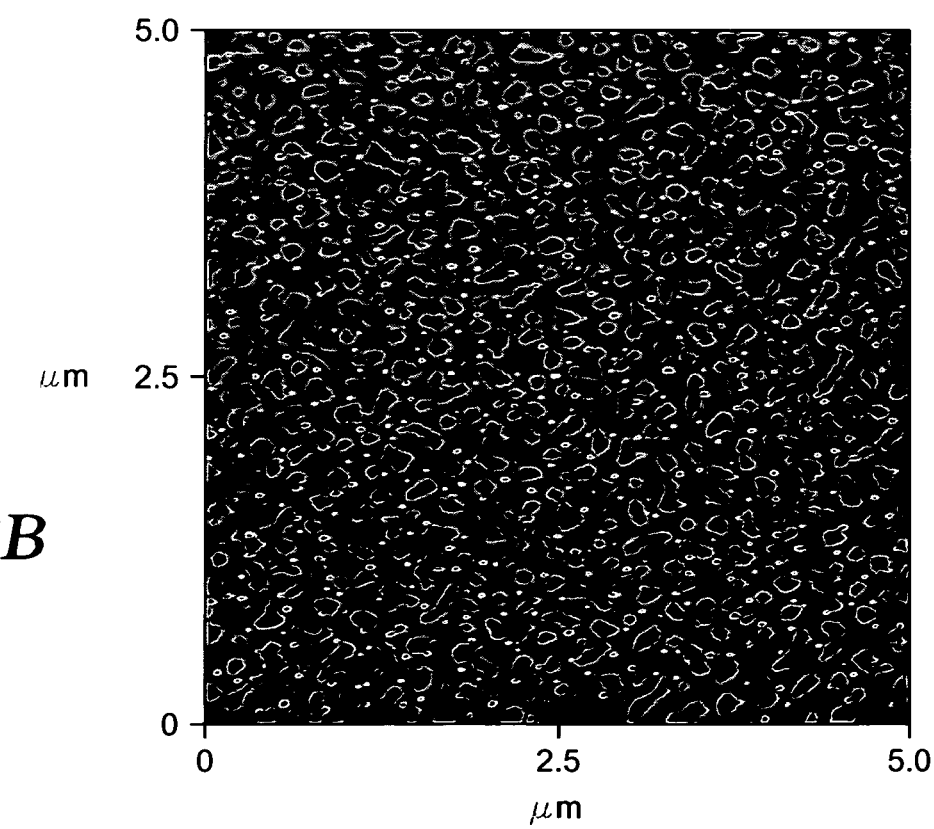

FIGS. 3A and 3B are schematics of AFM (atomic force microscope) images of surfaces of silicon oxide bonding coatings as applied over a silicon substrate. The initial silicon substrate surface RMS roughness was determined to be less than about 0.1 nm. FIG. 3A illustrates a deposition process in which the substrate was silicon. The surface of the silicon was exposed to an oxygen plasma in the manner previously described herein for purposes of cleaning the surface and creating hydroxyl availability on the silicon surface. $SiCl_4$ was charged to the process chamber from a $SiCl_4$ vapor reservoir, creating a partial pressure of 0.8 Torr in the coating process chamber. Within 10 seconds, $H_2O$ vapor was charged to the process chamber from a $H_2O$ vapor reservoir, creating a partial pressure of 4 Torr in the coating process chamber. The total pressure in the coating process chamber was 4.8 Torr. The substrate temperature and the temperature of the process chamber walls was about 35° C. The substrate was exposed to the mixture of $SiCl_4$ and $H_2O$ for a time period of 10 minutes. The silicon oxide coating thickness obtained was about 3 nm. The coating roughness in RMS was 1.4 nm and Ra was 0.94 nm.

FIG. 3B illustrates a deposition process in which the substrate was silicon. The surface of the silicon was exposed to an oxygen plasma in the manner previously described herein for purposes of cleaning the surface and creating hydroxyl availability on the silicon surface. $SiCl_4$ was charged to the process chamber from a $SiCl_4$ vapor reservoir, creating a partial pressure of 4 Torr in the coating process chamber. Within 10 seconds, $H_2O$ vapor was charged to the process chamber from a $H_2O$ vapor reservoir, creating a partial pressure of 10 Torr in the coating process chamber. The total pressure in the coating process chamber was 14 Torr. The substrate temperature and the temperature of the process chamber walls was about 35° C. The substrate was exposed to the mixture of $SiCl_4$ and $H_2O$ for a time period of 10 minutes. The silicon oxide coating thickness obtained was about 30 nm. The coating roughness in RMS was 4.2 nm and Ra was 3.4 nm.

Example Five

Figure 4:
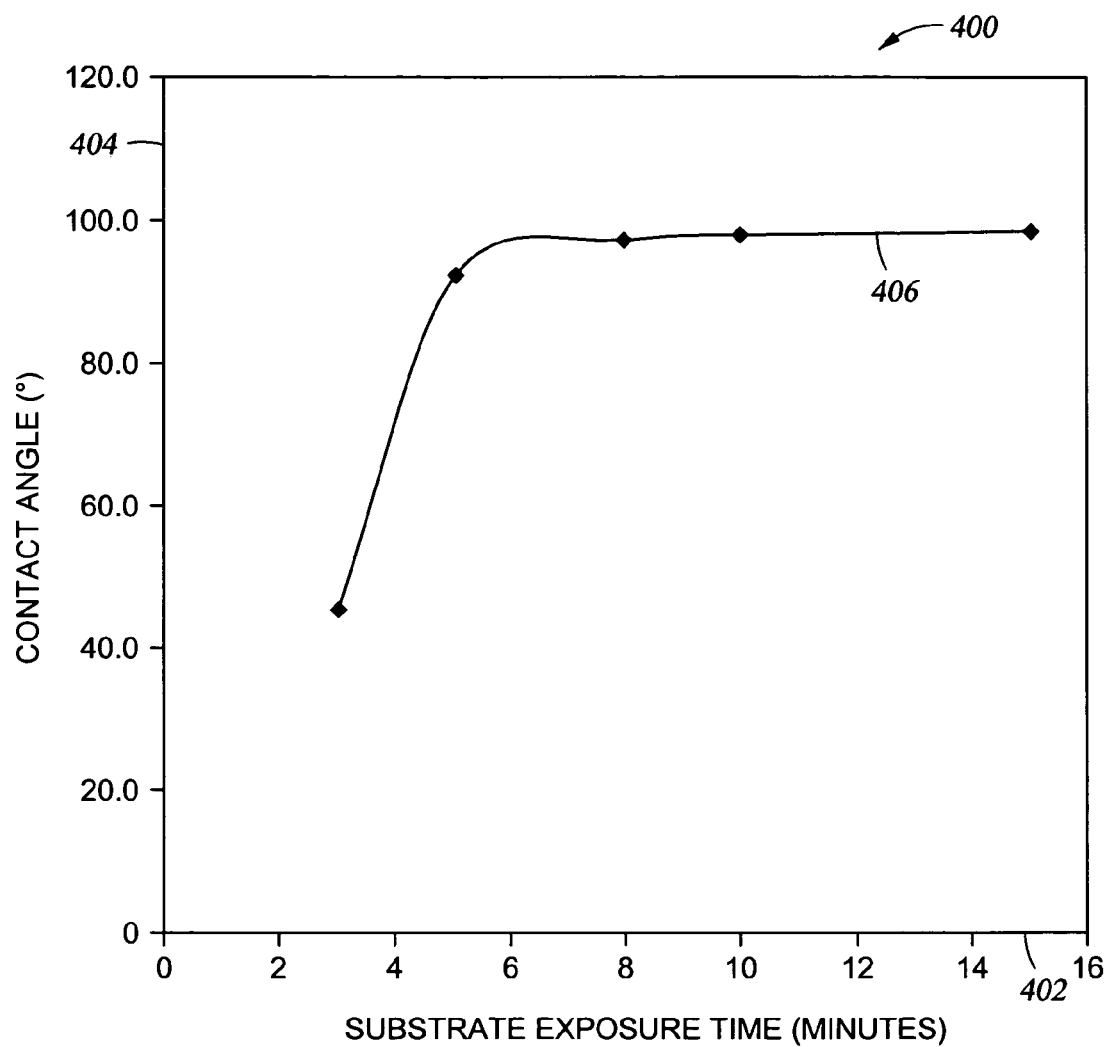
FIG. 4 shows a graph of the water contact angle obtained on a silicon substrate surface as a function of reaction time (exposure time to DDMS and $H_2O$ reactants) during coating formation.

FIG. 4 shows a graph 400 of the dependence of the water contact angle (an indication of hydrophobicity of a surface) as a function of the substrate exposure time (reaction time) with an organo-silane coating generated from a DDMS (dimethyldichlorosilane) precursor. The silicon substrate was cleaned and functionalized to provide surface hydroxyl groups by an oxygen plasma treatment of the kind previously described herein. DDMS was then applied at a partial pressure of 1 Torr, followed within 10 seconds by $H_2O$ applied at a partial pressure of 2 Torr, to produce a total pressure within the process chamber of 3 Torr.

In FIG. 4, graph 400, the substrate exposure period with respect to the DDMS and $H_2O$ precursor combination is shown in minutes on axis 402, with the contact angle shown in degrees on axis 404. Curve 406 illustrates that it is possible to obtain a wide range of hydrophobic surfaces by controlling the process variables in the manner of the present invention. The typical standard deviation of the contact angle was less than 2 degrees across the substrate surface. Both wafer-to wafer and day-to day repeatability of the water contact angle were within the measurement error of $\mp 2°$ for a series of silicon samples.

Figure 5:
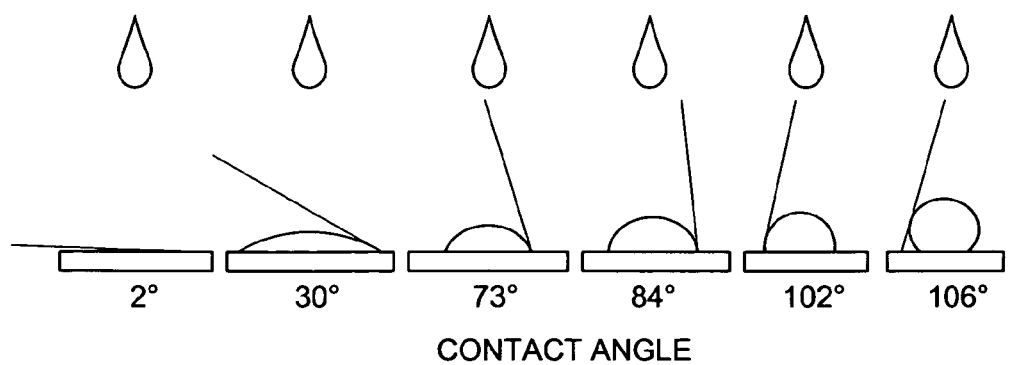
FIG. 5 shows a series of water contact angles measured for a coating surface where the coating was produced from a FOTS precursor on the surface of a silicon substrate. The higher the contact angle, the higher the hydrophobicity of the coating surface.

FIG. 5 illustrates contact angles for a series of surfaces exposed to water, where the surfaces exhibited different hydrophobicity, with an increase in contact angle representing increased hydrophobicity. This data is provided as an illustration to make the contact angle data presented in tables herein more meaningful.

Example Six

Figure 6A:
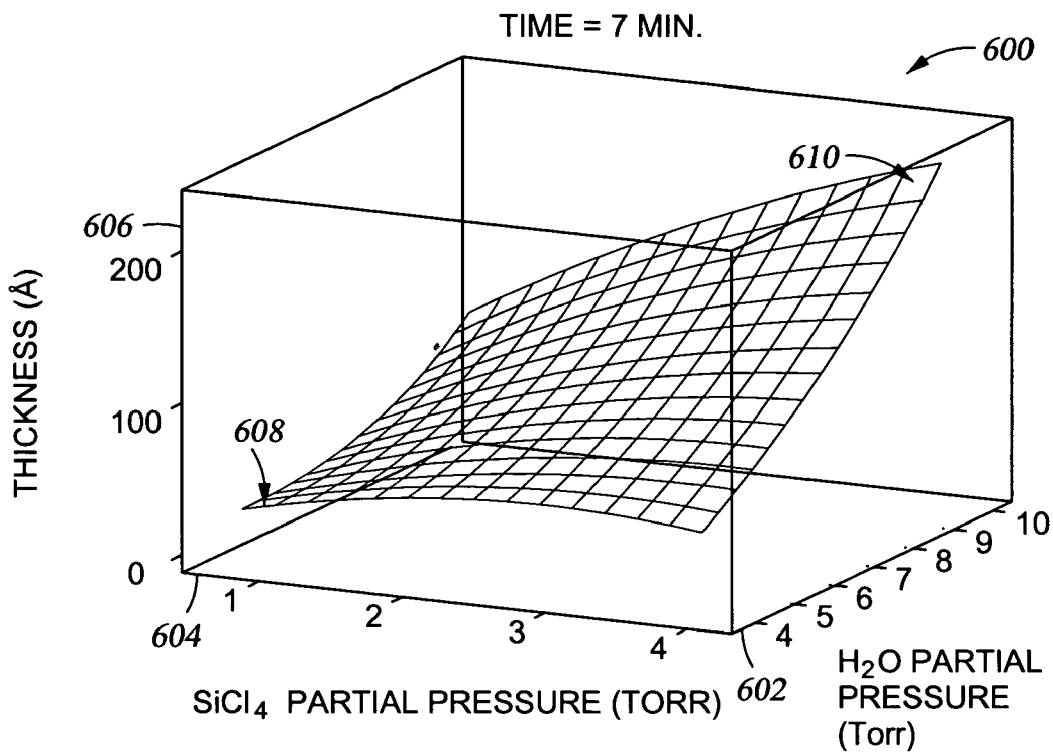
FIG. 6A shows a three dimensional plot of film thickness of a silicon oxide bonding layer coating deposited on a silicon surface as a function of the partial pressure of silicon tetrachloride and the partial pressure of water vapor present in the process chamber during deposition of the silicon oxide coating, where the time period the silicon substrate was exposed to the coating precursors was four minutes after completion of addition of all precursor materials.

FIG. 6A shows a three dimensional schematic 600 of film thickness of a silicon oxide bonding layer coating deposited on a silicon surface as a function of the partial pressure of silicon tetrachloride and the partial pressure of water vapor present in the process chamber during deposition of the silicon oxide coating, where the temperature of the substrate and of the coating process chamber walls was about 35° C., and the time period the silicon substrate was exposed to the coating precursors was four minutes after completion of addition of all precursor materials. The precursor $SiCl_4$ vapor was added to the process chamber first, with the precursor $H_2O$ vapor added within 10 seconds thereafter. The partial pressure of the $H_2O$ in the coating process chamber is shown on axis 602, with the partial pressure of the $SiCl_4$ shown on axis 604. The film thickness is shown on axis 606 in Angstroms. The film deposition time after addition of the precursors was 4 minutes. The thinner coatings exhibited a smoother surface, with the RMS roughness of a coating at point 608 on Graph 600 being in the range of 1 nm (10 Å). The thicker coatings exhibited a rougher surface, which was still smooth relative to coatings generally known in the art. At point 610 on Graph 600, the RMS roughness of the coating was in the range of 4 nm (40 Å).

Figure 7A:
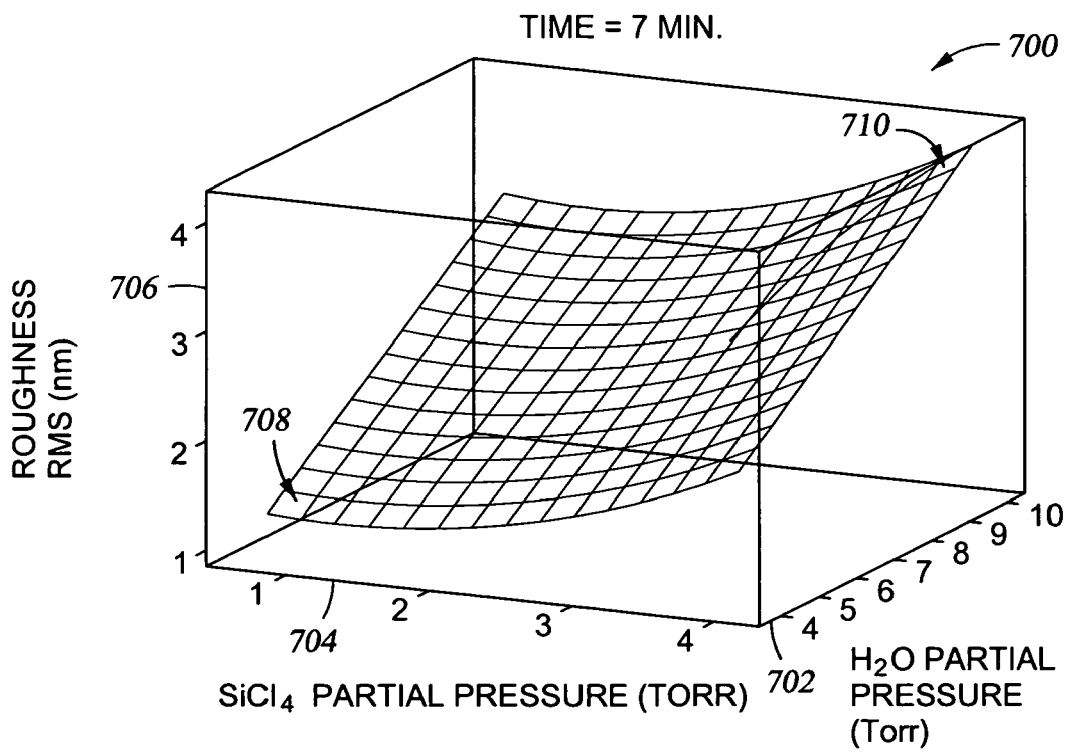
FIG. 7A shows a three dimensional plot of film roughness in RMS nm of a silicon oxide bonding layer coating deposited on a silicon surface as a function of the partial pressure of silicon tetrachloride and the partial pressure of water vapor present in the process chamber during deposition of the silicon oxide coating, where the time period the silicon substrate was exposed to the coating precursors was four minutes after completion of addition of all precursor materials.

FIG. 7A shows a three dimensional schematic 700 of the film roughness in RMS, nm which corresponds with the coated substrate for which the coating thickness is illustrated in FIG. 6A. The partial pressure of the $H_2O$ in the coating process chamber is shown on axis 702, with the partial pressure of the $SiCl_4$ shown on axis 704. The film roughness in RMS, nm is shown on axis 706. The film deposition time after addition of all of the precursors was 7 minutes. As previously mentioned, the thinner coatings exhibited a smoother surface, with the RMS roughness of a coating at point 708 being in the range of 1 nm (10 Å) and the roughness at point 710 being in the range of 4 nm (40 Å).

Figure 6B:
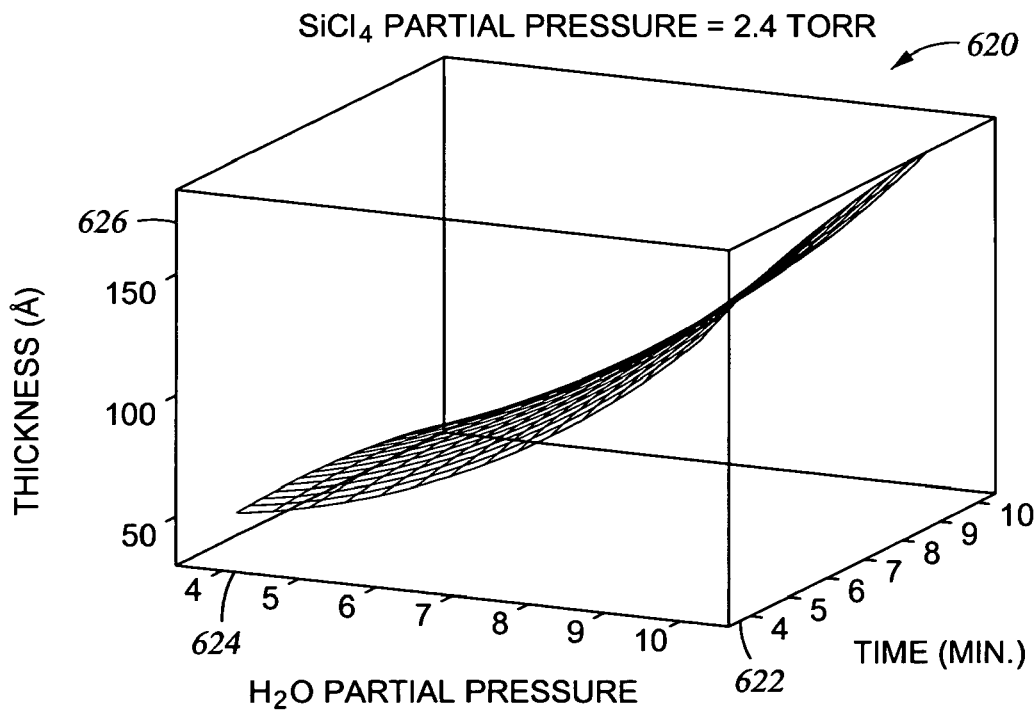
FIG. 6B shows a three dimensional plot of film thickness of the silicon oxide bonding layer illustrated in FIG. 6A as a function of the water vapor partial pressure and the time period the substrate was exposed to the coating precursors after completion of addition of all precursor materials.

FIG. 6B shows a three dimensional schematic 620 of film thickness of the silicon oxide bonding layer illustrated in FIG. 6A as a function of the water vapor partial pressure and the time period the substrate was exposed to the coating precursors after completion of addition of all precursor materials. The time period of exposure of the substrate is shown on axis 622 in minutes, with the $H_2O$ partial pressure shown on axis 624 in Torr, and the oxide coating thickness shown on axis 626 in Angstroms. The partial pressure of $SiCl_4$ in the silicon oxide coating deposition chamber was 0.8 Torr.

Figure 6C:
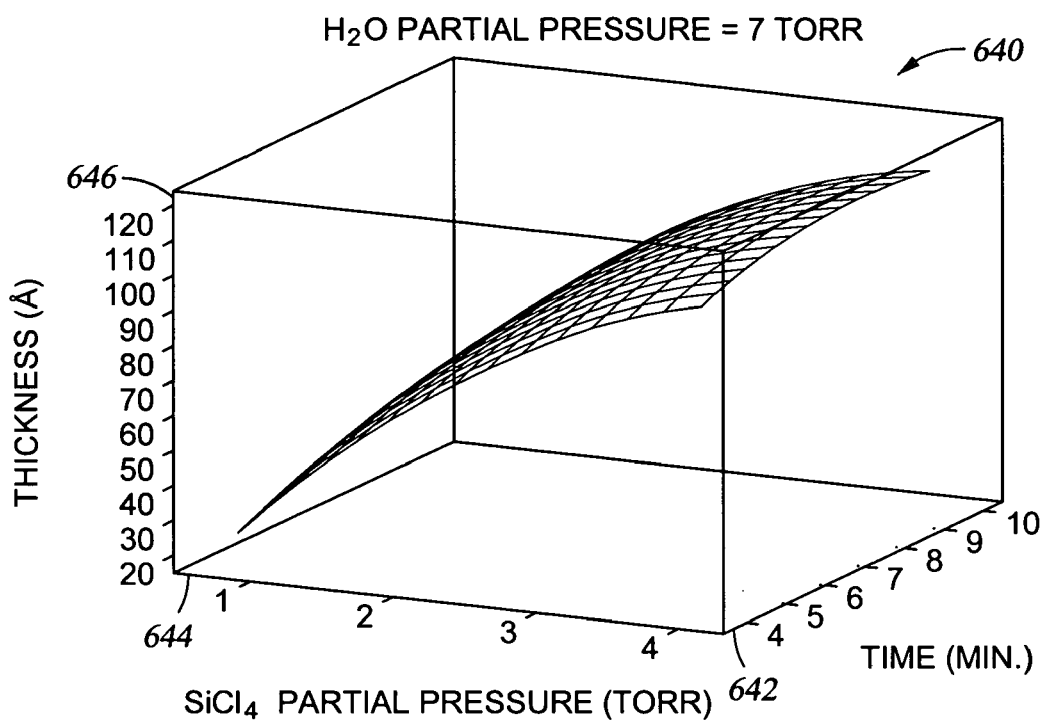
FIG. 6C shows a three dimensional plot of film thickness of the silicon oxide bonding layer illustrated in FIG. 6A as a function of the silicon tetrachloride partial pressure and the time period the substrate was exposed to the coating precursors after completion of addition of all precursor materials.

FIG. 6C shows a three dimensional schematic 640 of film thickness of the silicon oxide bonding layer illustrated in FIG. 6A as a function of the silicon tetrachloride partial pressure and the time period the substrate was exposed to the coating precursors after completion of addition of all precursor materials. The time period of exposure is shown on axis 642 in minutes, with the $SiCl_4$ partial pressure shown on axis 646 in Torr, and the oxide thickness shown on axis 646 in Angstroms. The $H_2O$ partial pressure in the silicon oxide coating deposition chamber was 4 Torr.

A comparison of FIGS. 6A-6C makes it clear that it is the partial pressure of the $H_2O$ which must be more carefully controlled in order to ensure that the desired coating thickness is obtained.

Figure 7B:
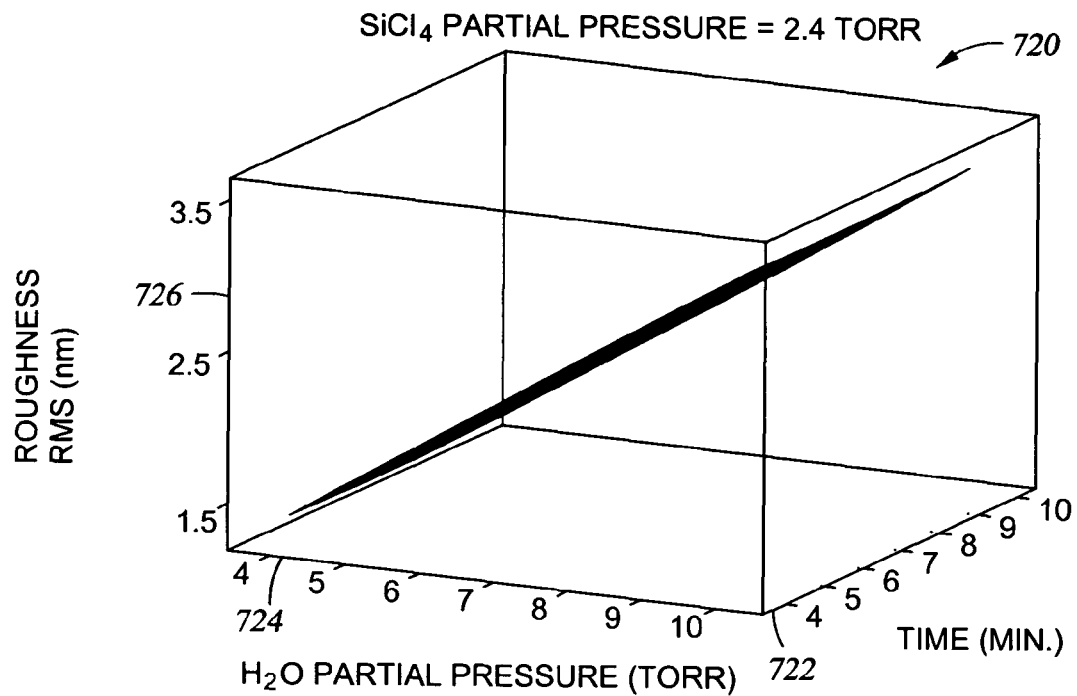
FIG. 7B shows a three dimensional plot of film roughness in RMS nm of the silicon oxide bonding layer illustrated in FIG. 7A as a function of the water vapor partial pressure and the time period the substrate was exposed to the coating precursors after completion of addition of all precursor materials.

FIG. 7B shows a three dimensional schematic 720 of film roughness of the silicon oxide bonding layer illustrated in FIG. 6B as a function of the water vapor partial pressure and the time period the substrate was exposed to the coating precursors after completion of addition of all precursor materials. The time period of exposure of the substrate is shown on axis 722 in minutes, with the $H_2O$ partial pressure shown on axis 724 in Torr, and the surface roughness of the silicon oxide layer shown on axis 726 in RMS, nm. The partial pressure of the SiCl$_4$ in the silicon oxide coating deposition chamber was 2.4 Torr.

Figure 7C:
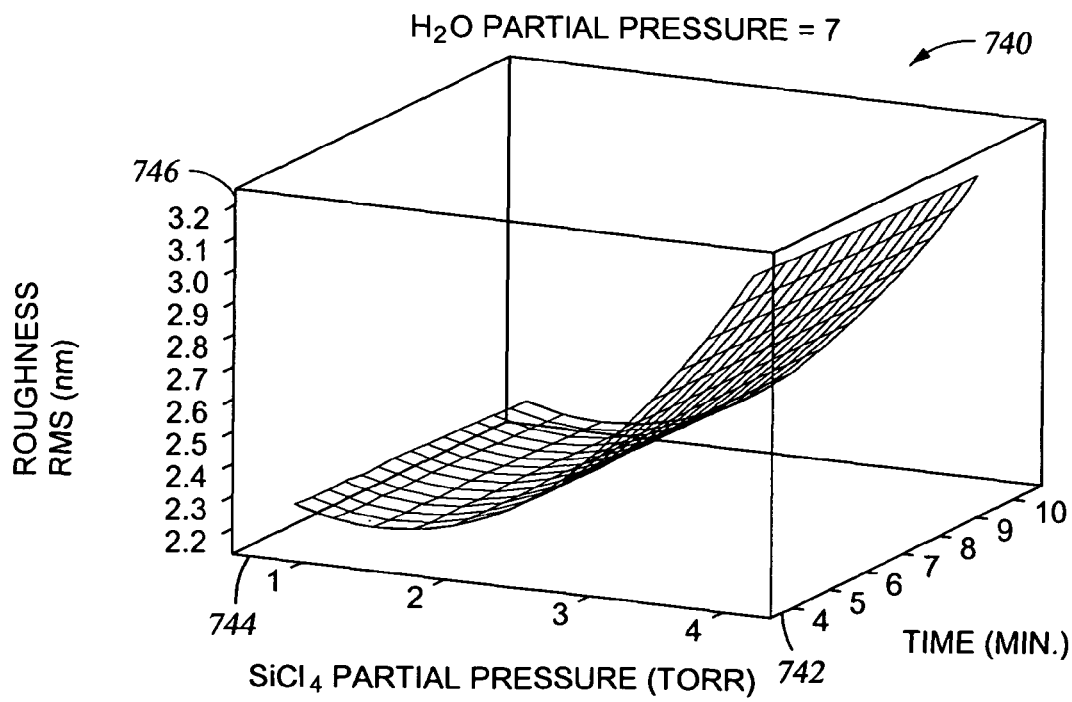
FIG. 7C shows a three dimensional plot of film roughness in RMS nm of the silicon oxide bonding layer illustrated in FIG. 6A as a function of the silicon tetrachloride partial pressure and the time period the substrate was exposed to the coating precursors after completion of addition of all precursor materials.

FIG. 7C shows a three dimensional schematic 740 of film roughness thickness of the silicon oxide bonding layer illustrated in FIG. 6C as a function of the silicon tetrachloride partial pressure and the time period the substrate was exposed to the coating precursors after completion of addition of all precursor materials. The time period of exposure is shown on axis 642 in minutes, with the SiCl$_4$ partial pressure shown on axis 646 in Torr, and the surface roughness of the silicon oxide layer shown on axis 746 in RMS, nm. The partial pressure of the H$_2$O in the silicon oxide coating deposition chamber was 7.0 Torr.

A comparison of FIGS. 7A-7C makes it clear that it is the partial pressure of the H$_2$O which must be more carefully controlled in order to ensure that the desired roughness of the coating surface is obtained.

Figure 8A:
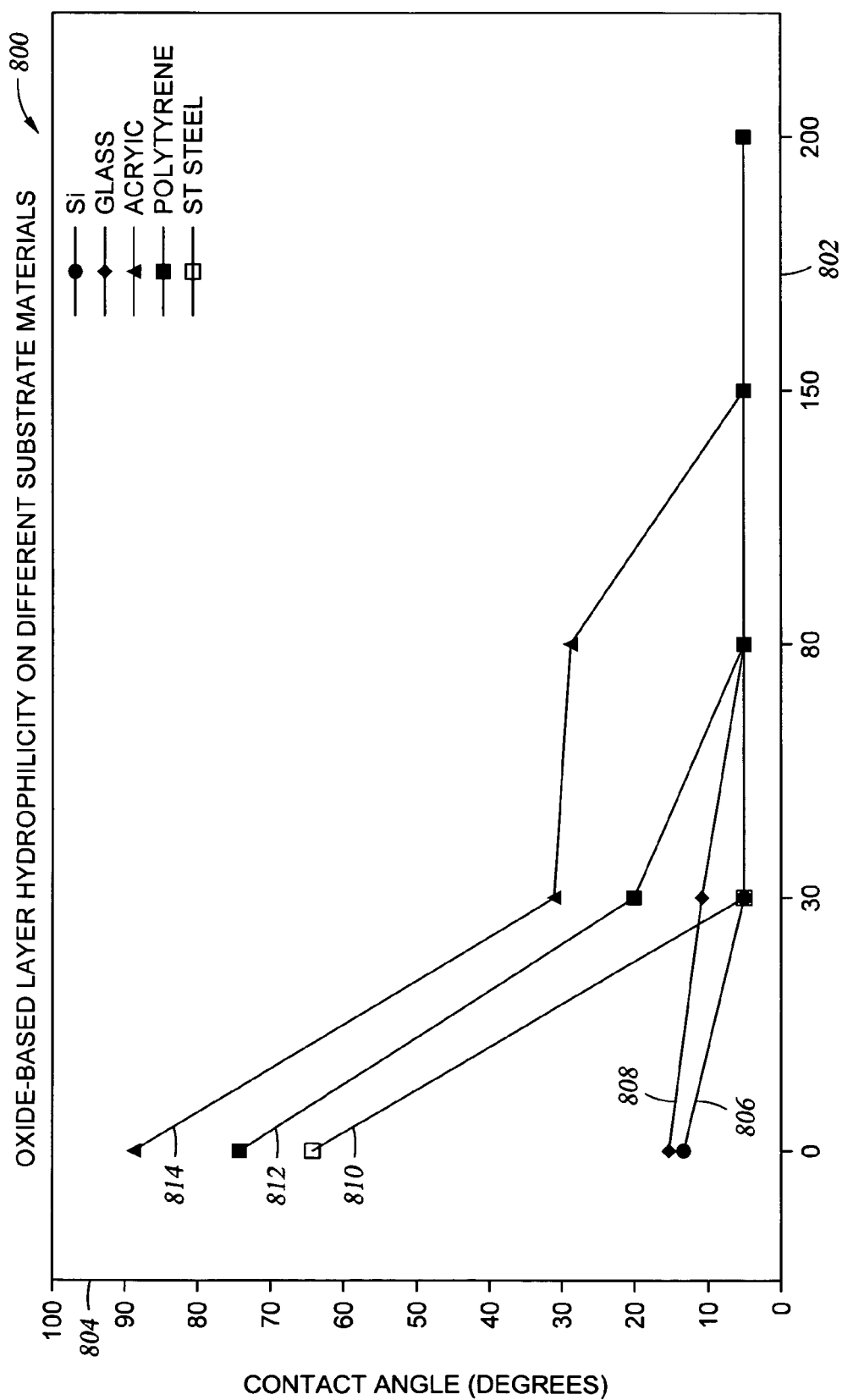
FIG. 8A illustrates the change in hydrophilicity of the surface of the initial substrate as a function of the thickness of an oxide-based bonding layer generated over the initial substrate surface using an oxygen plasma, moisture, and carbon tetrachloride. When the oxide thickness is adequate to provide full coverage of the substrate surface, the contact angle on the surface drops to about 5 degrees or less.

FIG. 8A is a graph 800 which shows the hydrophilicity of an oxide-based layer on different substrate materials, as a function of the thickness of the oxide-based layer. The data presented in FIG. 8A indicates that to obtain full surface coverage by the oxide-based layer, it is necessary to apply a different thickness of oxide-based layer depending on the underlying substrate material.

In particular, the oxide-based layer was a silicon-oxide-based layer prepared in general in the manner described above, with respect to Run No. 4 in Table III, but where the nominal amounts of reactants charged and/or reaction time of the reactants were varied to provide the desired silicon oxide layer thickness, which is specified on axis 802 of FIG. 8A. The graph 800 shows the contact angle for a deionized (DI) water droplet, in degrees, on axis 804, as measured for a given oxide-based layer surface, as a function of the thickness of the oxide-based layer in Angstroms shown on axis 802. Curve 806 illustrates a silicon-oxide-based layer deposited over a single crystal silicon wafer surface. Curve 808 represents a silicon-oxide-based layer deposited over a soda lime glass surface. Curve 810 illustrates a silicon-oxide-based layer deposited over a stainless steel surface. Curve 812 shows a silicon-oxide-based layer deposited over a polystyrene surface. Curve 814 illustrates a silicon-oxide-based layer deposited over an acrylic surface.

Graph 800 shows that a single crystal silicon substrate required only about a 30 Å thick coating of a silicon oxide-based layer to provide a DI water droplet contact angle of about 5 degrees, indicating the maximum hydrophilicity typically obtained using a silicon oxide-based layer. The glass substrate required about 80 Å of the silicon oxide-based layer to provide a contact angle of about 5 degrees. The stainless steel substrate required a silicon oxide-based layer thickness of about 80 Å to provide the contact angle of 5 degrees. The polystyrene substrate required a silicon oxide-based layer thickness of about 80 Å to provide the contact angle of 5 degrees. And, the acrylic substrate required a silicon oxide-based layer thickness of about 150 Å. It should be mentioned that the hydrophilicity indicated in FIG. 8A was measured immediately after completion of the coating process, since the nominal value measured may change during storage.

Figure 8B:
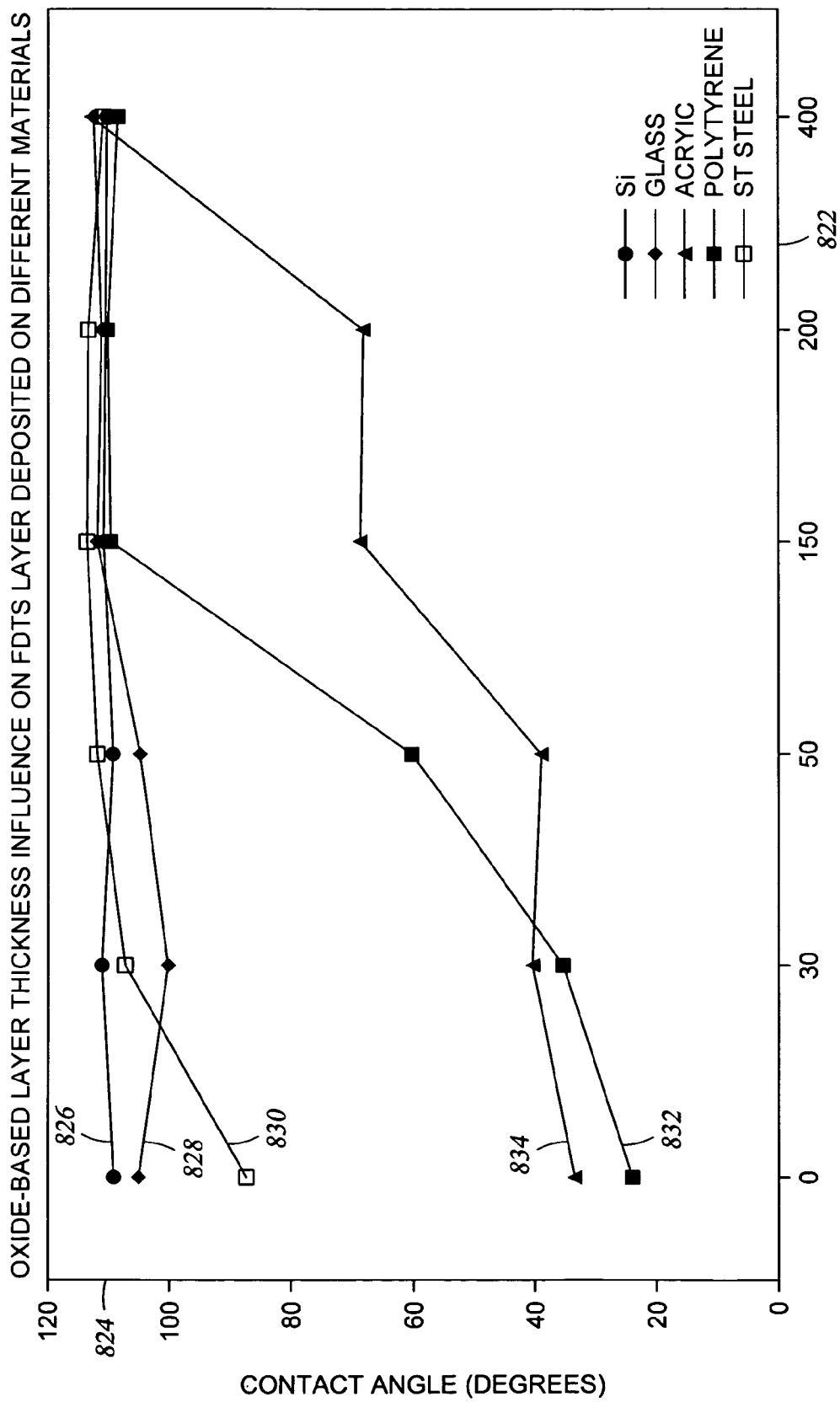
FIG. 8B illustrates the minimal thickness of oxide-based bonding layer which is required to provide adhesion of an organic-based layer, as a function of the initial substrate material, when the organic-based layer is one where the end or the organic-based layer which bonds to the oxide-based bonding layer is a silane and where the end of the organic-based layer which does not bond to the oxide-based bonding layer provides a hydrophobic surface. When the oxide thickness is adequate to provide uniform attachment of the organic-based layer, the contact angle on the substrate surface increases to about 110 degrees or greater.

FIG. 8B shows a graph 820, which illustrates the relationship between the hydrophobicity obtained on the surface of a SAM layer deposited from perfluorodecyltrichlorosilane (FDTS), as a function of the thickness of an oxide-based layer over which the FDTS layer was deposited. The oxide layer was deposited in the manner described above, using tetrachlorosilane precursor, with sufficient moisture that a silicon oxide surface having sufficient hydroxyl groups present to provide a surface contact angle (with a DI water droplet) of 5 degrees was produced.

The oxide-based layer and the organic-based layer generated from an FDTS precursor were deposited as follows: The process chamber was vented and the substrate was loaded into the chamber. Prior to deposition of the oxide-based layer, the surface of the substrate was plasma cleaned to eliminate residual surface contamination and to oxygenate/hydroxylate the substrate. The chamber was pumped down to a pressure in the range of about 30 mTorr or less. The substrate surface was then plasma treated using a low density, non-physically-bombarding plasma which was created externally from a plasma source gas containing oxygen. The plasma was created in an external chamber which is a high efficiency inductively coupled plasma generator, and was fed into the substrate processing chamber. The plasma treatment was in the manner previously described herein, where the processing chamber pressure during plasma treatment was in the range of about 0.5 Torr, the temperature in the processing chamber was about 35° C., and the duration of substrate exposure to the plasma was about 5 minutes.

After plasma treatment, the processing chamber was pumped down to a pressure in the range of about 30 mTorr or less to evacuate remaining oxygen species. Optionally, processing chamber may be purged with nitrogen up to a pressure of about 10 Torr to about 20 Torr and then pumped down to the pressure in the range of about 30 mTorr. An adhering oxide-based layer was then deposited on the substrate surface. The thickness of the oxide-based layer depended on the substrate material, as previously discussed. SiCl$_4$ vapor was injected into the process chamber at a partial pressure to provide a desired nominal oxide-based layer thickness. To produce an oxide-based layer thickness ranging from about 30 Å to about 400 Å, typically the partial pressure in the process chamber of the SiCl$_4$ vapor ranges from about 0.5 Torr to about 4 Torr, more typically from about 1 Torr to about 3 Torr. Typically, within about 10 seconds of injection of the SiCl$_4$ vapor, water vapor was injected at a specific partial pressure ratio to the SiCl$_4$ to form the adhering silicon-oxide based layer on the substrate. Typically the partial pressure of the water vapor ranges from about 2 Torr to about 8 Torr, and more typically from about 4 Torr to about 6 Torr. (Several volumes of SiCl$_4$ and/or several volumes of water may be injected into the process chamber to achieve the total partial pressures desired, as previously described herein.) The reaction time to produce the oxide layer may range from about 5 minutes to about 15 minutes, depending on the processing temperature, and in the exemplary embodiments described herein the reaction time used was about 10 minutes at about 35° C.

After deposition of the oxide-based layer, the chamber was once again pumped down to a pressure in the range of about 30 mTorr or less. Optionally, the processing chamber may be purged with nitrogen up to a pressure of about 10 Torr to about 20 Torr and then pumped down to the pressure in the range of about 30 mTorr, as previously described. The organic-based layer deposited from an FDTS precursor was then produced by injecting FDTS into the process chamber to provide a partial pressure ranging from about 30 mTorr to about 1500 mTorr, more typically ranging from about 100 mTorr to about 300 mTorr. The exemplary embodiments described herein were typically carried out using an FDTS partial pressure of about 150 mTorr. Within about 10 seconds after injection of the FDTS precursor, water vapor was injected into the process chamber to provide a partial pressure of water vapor ranging from about 300 mTorr to about 1000 mTorr, more typically ranging from about 400 mTorr to about 800 mTorr. The exemplary embodiments described herein were typically carried out using a water vapor partial pressure of about 600 mTorr. The reaction time for formation of the organic-based layer (a SAM) ranged from about 5 minutes to about 30 minutes, depending on the processing temperature, more typically from about 10 minutes to about 20 minutes, and in the exemplary embodiments described herein the reaction time used was about 15 minutes at about 35° C.

The data presented in FIG. 8B indicates that to obtain the maximum hydrophobicity at the surface of the FDTS-layer, it is not only necessary to have an oxide-based layer thickness which is adequate to cover the substrate surface, but it is also necessary to have a thicker layer in some instances, depending on the substrate underlying the oxide-based layer Since the silicon oxide layer is conformal, it would appear that the increased thickness is not necessary to compensate for roughness, but has a basis in the chemical composition of the substrate. However, as a matter of interest, the initial roughness of the silicon wafer surface was about 0.1 RMS nm, and the initial roughness of the glass surface was about 1-2 RMS nm.

In particular, the oxide-based layer was a silicon-oxide-based layer prepared in the manner described above, with respect to FIG. 8A. The graph 820 shows the contact angle of a DI water droplet, in degrees, on axis 824, as measured for an oxide-based layer surface over different substrates, as a function of the thickness of the oxide-based layer in Angstroms shown on axis 822. Curve 826 illustrates a silicon-oxide-based layer deposited over a single crystal silicon wafer surface described with reference to FIG. 8A. Curve 828 represents a silicon-oxide-based layer deposited over a glass surface as described with reference to FIG. 8A. Curve 830 illustrates a silicon-oxide-based layer deposited over a stainless steel surface, as described with reference to FIG. 8A. Curve 832 shows a silicon-oxide-based layer deposited over a polystyrene surface, as described with reference to FIG. 8A. Curve 834 illustrates a silicon-oxide-based layer deposited over an acrylic surface described with reference to FIG. 8A. The FDTS-generated SAM layer provides an upper surface containing fluorine atoms, which is generally hydrophobic in nature. The maximum contact angle provided by this fluorine-containing upper surface is about 117 degrees. As illustrated in FIG. 8B, this maximum contact angle, indicating an FDTS layer covering the entire substrate surface is only obtained when the underlying oxide-based layer also covers the entire substrate surface at a particular minimum thickness. There appears to be another factor which requires a further increase in the oxide-based layer thickness, over and above the thickness required to fully cover the substrate, with respect to some substrates. It appears this additional increase in oxide-layer thickness is necessary to fully isolate the surface organic-based layer, a self-aligned-monolayer (SAM), from the effects of the underlying substrate. It is important to keep in mind that the thickness of the SAM deposited from the FDTS layer is only about 10 Å to about 20 Å.

Graph 820 shows that a SAM surface layer deposited from FDTS over a single crystal silicon substrate exhibits the maximum contact angle of about 117 degrees when the oxide-based layer overlying the single crystal silicon has a thickness of about 30 Å or greater. The surface layer deposited from FDTS over a glass substrate exhibits the maximum contact angle of about 117 degrees when the oxide-based layer overlying the glass substrate has a thickness of about 150 Å or greater. The surface layer deposited from FDTS over the stainless steel substrate exhibits the maximum contact angle of about 117 degrees when the oxide-based layer overlying the stainless steel substrate has a thickness of between 80 Å and 150 Å or greater. The surface layer deposited from FDTS over the polystyrene substrate exhibits the maximum contact angle when the oxide-based layer overlying the polystyrene substrate has a thickness of 150 Å or greater. The surface layer deposited from FDTS over the acrylic substrate exhibits the maximum contact angle when the oxide-based layer overlying the acrylic substrate has a thickness of 400 Å or greater.

Figure 9A:
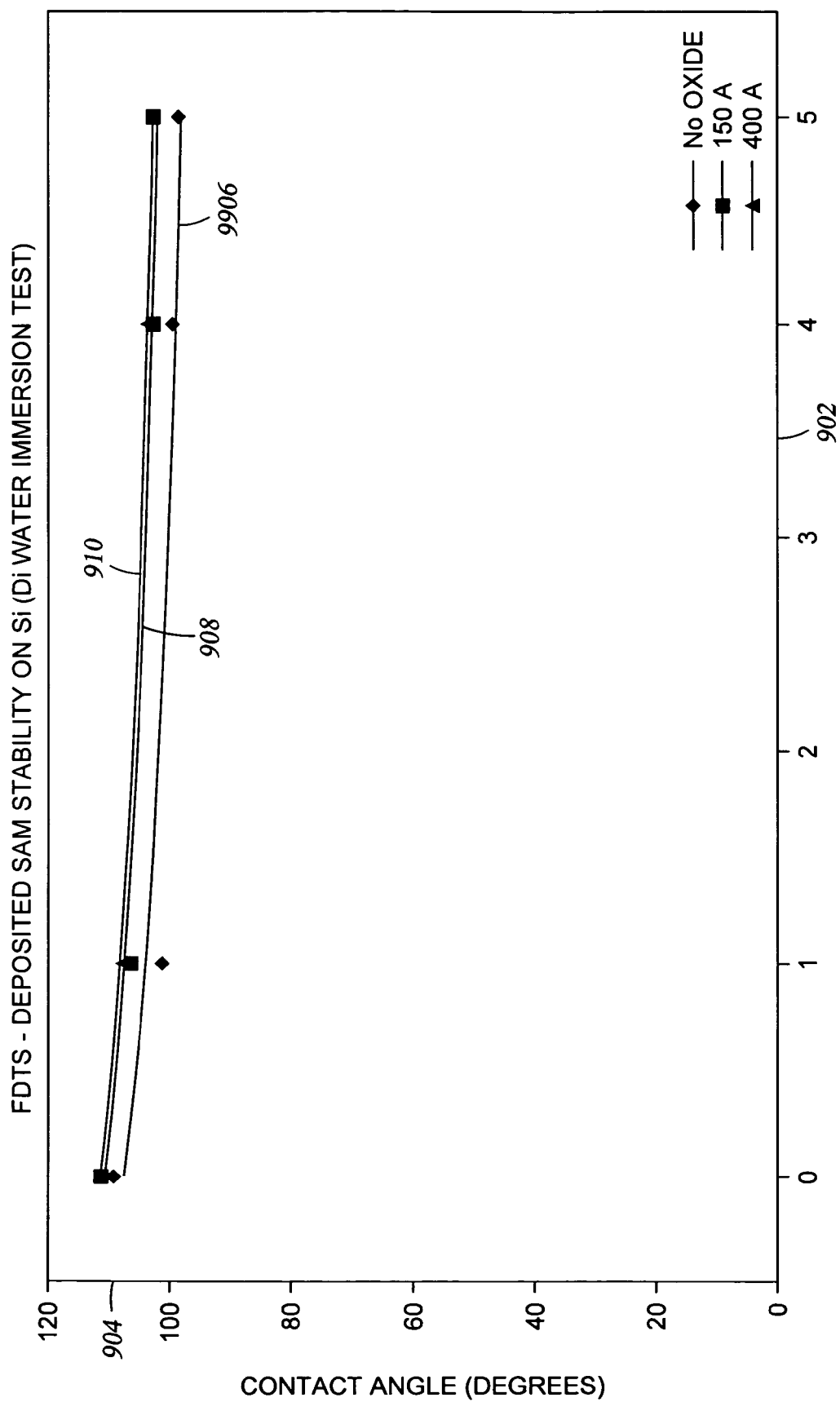
FIG. 9A shows stability in DI water for an organic-based self-aligning monolayer (SAM) generated from perfluorodecyltrichloro-silane (FDTS) applied over a silicon wafer surface; and, applied over a 150 Å thick oxide-based layer, or applied over a 400 Å thick oxide-based layer, where the initial substrate surface is a silicon wafer. For a silicon substrate (which provides a hydrophilic surface) the stability of the organic-based layer, in terms of the hydrophobic surface provided, is relatively good for each of the samples, and somewhat better for the test specimens where there is an oxide-based layer underlying the organic-based layer.
Figure 9B:
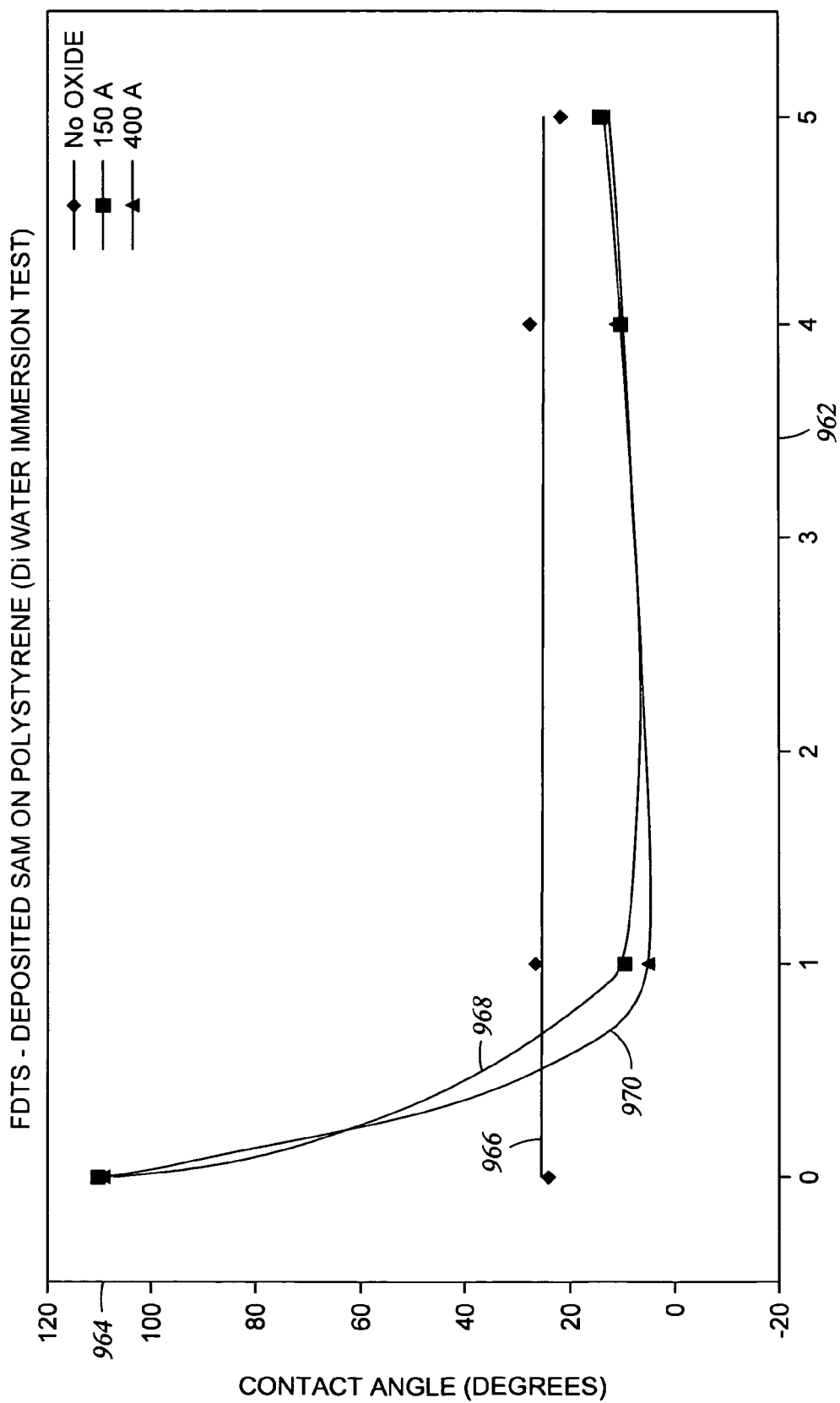
FIG. 9B shows stability in DI water for the same organic-based FDTS-generated SAM layer applied over the same oxide-based layers, where the initial substrate surface is polystyrene. There is minimal direct bonding of the organic-based layer to the polystyrene substrate. Initially, there is bonding of the organic-based layer to the polystyrene substrate, but the bonding fails relatively rapidly, so that the hydrophobic surface properties are lost.
Figure 9C:
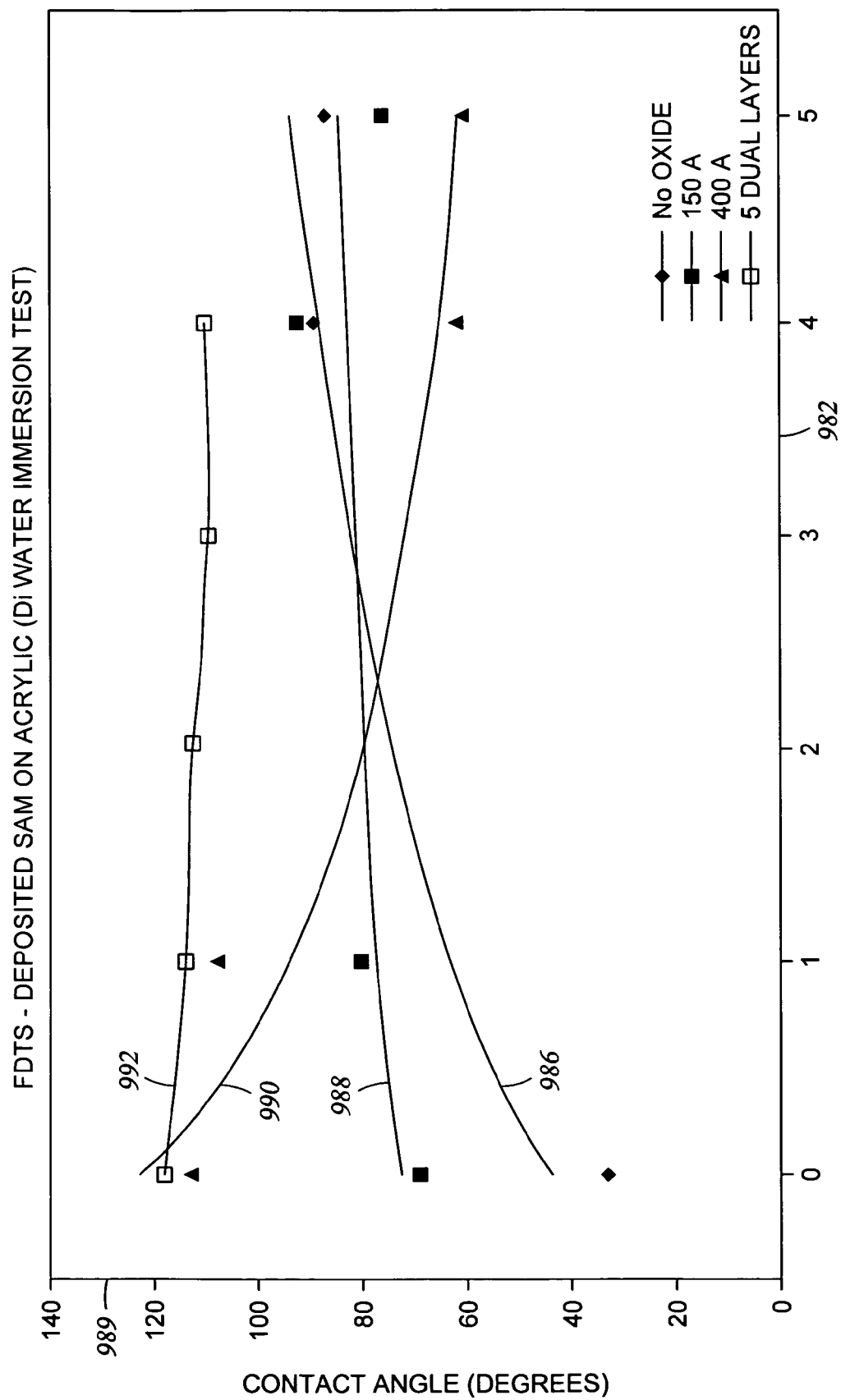
FIG. 9C shows stability in DI water for the same organic-based FDTS-generated SAM layer applied over the same two different thicknesses of an oxide-based layer as those shown in FIG. 9A, where the initial substrate surface is acrylic. Also shown is the improvement in long term reliability and performance when a series of five pairs of oxide-based layer/organic-based layer are applied over the acrylic substrate surface.

FIGS. 9A through 9C illustrate the stability of the hydrophobic surface provided by the SAM surface layer deposited from FDTS, when the coated substrate is immersed in deionized (DI) water for a specified time period. Each test specimen was plasma treated, then coated with oxide and SAM deposited from an FDTS precursor. Each test specimen size was about 1 $cm^2$ on the two major surfaces, and was coated on all sides. Each specimen was immersed into distilled water present in a 6 inch diameter round glass dish, without any means for circulating the water around the sample, and was allowed to stand in the water at atmospheric pressure and at room temperature (about 27° C.). After the time period specified, each specimen was blown dry using a gentle nitrogen gas sparging; there was no baking of the test specimens. After drying, a DI contact angle was measured on the test specimen surface using the contact angle test method previously described herein, which is generally known in the art.

FIGS. 9A-9C indicate that, depending on the underlying substrate, there are some instances where a thicker layer of oxide-based material deposited over the substrate is not able to provide a stable structure of the kind which ensures that the upper surface of the organic-based layer will maintain the desired surface properties in terms of hydrophobicity.

FIG. 9A shows a graph 900 illustrating surface physical property data (contact angle with a DI water droplet) for an approximately 15 Å thick layer of a SAM deposited from FDTS, where the underlying substrate is a single crystal silicon substrate (Curve 906); or, a single crystal silicon substrate having a 150 Å thick layer of silicon oxide deposited over the silicon substrate (Curve 908); or, a single crystal silicon substrate having a 400 Å thick layer of silicon oxide deposited over the silicon substrate (Curve 910). The DI water droplet contact angle is shown on axis 904 in degrees; the number of days of immersion of the substrate (with overlying oxide and SAM layer in place) is shown on axis 902 in days. The silicon oxide layer and the overlying layer of SAM deposited from FDTS were deposited in the manner described above with respect to FIGS. 8A-8B. For a silicon substrate (which provides a hydrophilic surface) the stability of the organic-based layer in terms of the hygroscopic surface provided is relatively good for each of the samples, and somewhat better for the test specimens where there is an oxide-based layer underlying the organic-based layer. The test specimens having the oxide-based layer over the silicon substrate maintained a contact angle of about 103-105 after 5 days of water immersion, while the test specimen without the oxide-based layer dropped to a contact angle of about 98.

FIG. 9B shows a graph 960 illustrating stability in DI water for the same organic-based layer applied over the same oxide-based layers in the same manner as described with respect to FIG. 9A, where the initial substrate surface was polystyrene. The DI water droplet contact angle is shown on axis 964 in degrees; the number of days of immersion of the substrate (with overlying oxide and SAM layer in place) is shown on axis 962 in days.

The test specimen which did not have an oxide-based layer deposited over the substrate (Curve 966) exhibited a low contact angle in the range of about 20°, indicating that plasma treatment caused the polystyrene surface to become hydrophilic. The test specimens which did have an oxide-based layer deposited over the substrate (a 150 Å thick layer of silicon oxide deposited over the polystyrene substrate (Curve 968) or a 400 Å thick layer of silicon oxide (Curve 970)) initially exhibited the hydrophobic surface properties expected when a SAM film is deposited over the substrate. The contact angle was about 117, indicating approximately the maximum amount of hydrophobicity which is obtainable from the surface of a SAM deposited from FDTS. This contact angle decreased drastically, in less than one day, to a contact angle in the range of about 4-8 degrees. This catastrophic failure is indicative of a lack of adhesion of the oxide layer to the polystyrene material surface.

FIG. 9C shows a graph 980 of the stability in DI water for the same organic-based layer applied over the same two thicknesses of an oxide-based layer as those shown in FIG. 9A, where the initial substrate surface is acrylic. The contact angle in DI water is shown on axis 989, while the number of days if test specimen immersion in DI water is shown on axis 982.

Curve 986 shows the contact angle for a test specimen where the approximately 15 Å thick layer of a SAM deposited from FDTS was applied directly over the acrylic substrate. Curve 988 shows the contact angle for a test specimen where a 150 Å thick silicon oxide layer was applied over the acrylic substrate surface prior to application of the SAM layer. Curve 990 shows the contact angle for a test specimen where a 400 Å thick silicon oxide layer was applied over the acrylic substrate surface prior to application of the SAM layer. While increasing the thickness of the oxide layer helped to increase the initial hydrophobic properties of the substrate surface (indicating improved bonding of the SAM layer or improved surface coverage by the SAM layer), the structure was not stable, as indicated by the change in contact angle over time. In an effort to provide a more stable structure, we applied a multilayered structure over the acrylic substrate, with the multilayered structure including a series of five pairs of oxide-based layer/organic-based layer, to provide an organic-based surface layer. Curve 922 shows the stability of the hydrophobic surface layer obtained when this multilayered structure was applied. This indicates that it is possible to provide a stable structure which can withstand extended periods of water immersion by creating the multilayered structure described. The number of pairs (sets) of oxide-based layer/organic-based layer which are required depends on the substrate material. When the substrate material is acrylic, the number of sets of oxide-based layer/organic-based layer which should be used is 5 sets. For other substrate materials, the number of sets of oxide-based layer/organic-based layer may be fewer; however, use of at least two sets of layers helps provide a more mechanically stable structure.

The stability of the deposited SAM organic-based layers can be increased by baking for about one half hour at 110° C., to crosslink the organic-based layers. Baking of a single pair of layers is not adequate to provide the stability which is observed for the multilayered structure, but baking can even further improve the performance of the multilayered structure.

The integrated method for creating a multilayered structure of the kind described above includes: Treatment of the substrate surface to remove contaminants and to provide either —OH or halogen moieties on the substrate surface, typically the contaminants are removed using a low density oxygen plasma, or ozone, or ultra violet (UV) treatment of the substrate surface. The —OH or halogen moieties are commonly provided by deposition of an oxide-based layer in the manner previously described herein. A first SAM layer is then vapor deposited over the oxide-based layer surface. The surface of the first SAM layer is then treated using a low density isotropic oxygen plasma, where the treatment is limited to just the upper surface of the SAM layer, with a goal of activating the surface of the first SAM layer. It is important not to etch away the SAM layer down to the underlying oxide-based layer. By adjusting the oxygen plasma conditions and the time period of treatment, one skilled in the art will be able to activate the first SAM layer surface while leaving the bottom portion of the first SAM layer intact. Typically, the surface treatment is similar to a substrate pretreatment, where the surface is treated with the low density isotropic oxygen plasma for a time period ranging from about 25 seconds to about 60 seconds, and typically for about 30 seconds. In the apparatus described herein the pretreatment is carried out by pumping the process chamber to a pressure ranging from about 15 mTorr to about 20 mTorr, followed by flowing an externally-generated oxygen-based plasma into the chamber at a plasma precursor oxygen flow rate of about 50 sccm to 200 sccm, typically at about 150 sccm in the apparatus described herein, to create about 0.4 Torr in the substrate processing chamber.

After activation of the surface of the first SAM layer using the oxygen-based plasma, a second oxide-based layer is vapor deposited over the first sam layer. A second SAM layer is then vapor deposited over the second oxide-based layer. The second SAM layer is then plasma treated to activate the surface of the second SAM layer. The process of deposition of oxide-based layer followed by deposition of SAM layer, followed by activation of the SAM surface may be repeated a nominal number of times to produce a multilayered structure which provides the desired mechanical strength and surface properties. Of course there typically is no activation step after deposition of the final surface layer of the multilayered structure, where the surface properties desired are those of the final organic-based layer. It is important to mention that the final organic-based layer may be different from other organic-based layers in the structure, so that the desired mechanical properties for the structure may be obtained, while the surface properties of the final organic-based layer are achieved. The final surface layer is typically a SAM layer, but may also be an oxide-based layer.

As described previously herein, the thickness and roughness of the initial oxide-based layer can be varied over wide ranges by choosing the partial pressure of precursors, the temperature during vapor deposition, and the duration time of the deposition. Subsequent oxide-based layer thicknesses may also be varied, where the roughness of the surface may be adjusted to meet end use requirements. The thickness of an organic-based layer which is applied over the oxide-based layer will depend on the precursor molecular length of the organic-based layer. In the instance where the organic-based layer is a SAM, such as FOTS, for example, the thickness of an individual SAM layer will be in the range of about 15 Å. The thicknesses for a variety of SAM layers are known in the art. Other organic-based layer thicknesses will depend on the polymeric structure which is deposited using polymer vapor deposition techniques. The organic-based layers deposited may be different from each other, and may present hydrophilic or hydrophobic surface properties of varying degrees. In some instances, the organic-based layers may be formed from a mixture of more than one precursor. In some instances, the organic-based layer may be vapor deposited simultaneously with an oxide-based structure to provide crosslinking of organic and inorganic materials and the formation of a dense, essentially pinhole-free structure.

Example Seven

One example of an application for the multilayered coating which comprise a plurality of oxide-based layers and a plurality of organic-based layers is an ink jet of the kind commonly used in printing. The ability to print a fine character size depends on the size of the opening through which the ink flows prior to reaching the surface to be printed. In addition, depending on the ink to be used, in order to obtain ease of flow of the ink over the surface of the opening and the desired jetting action, the surface may need to be hydrophilic or hydrophobic in nature, with various degrees of contact angle between the ink and the surface of the opening being used to provide an advantage.

Figure 10A:
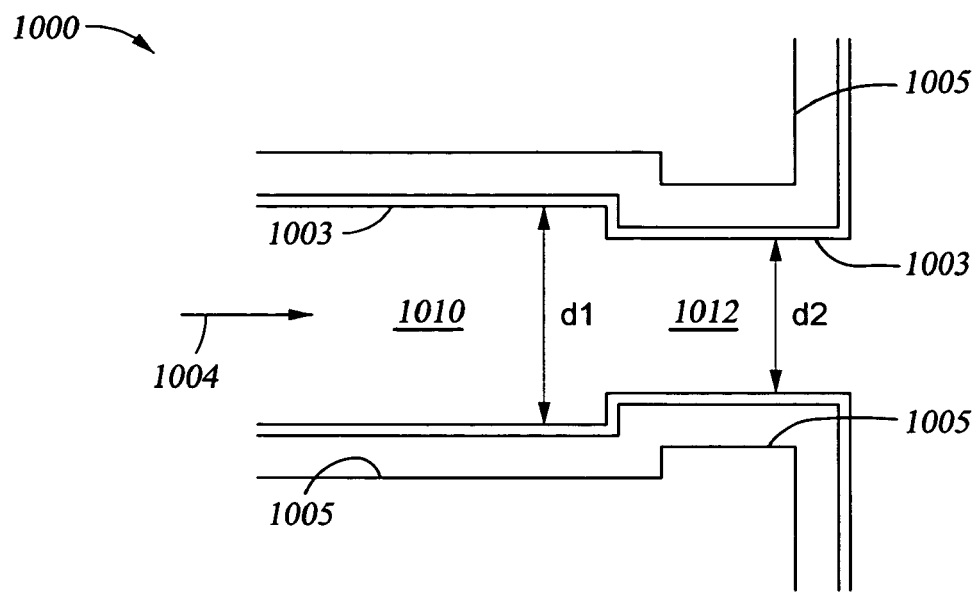
FIGS. 10A-10B show the use of a multilayered coating of one embodiment of the present invention, where the coating is used to increase the aspect ratio of a nozzle (shown in FIG. 10A) or an orifice (shown in FIG. 10B), while providing particular surface properties on the coated surfaces.
Figure 10B:
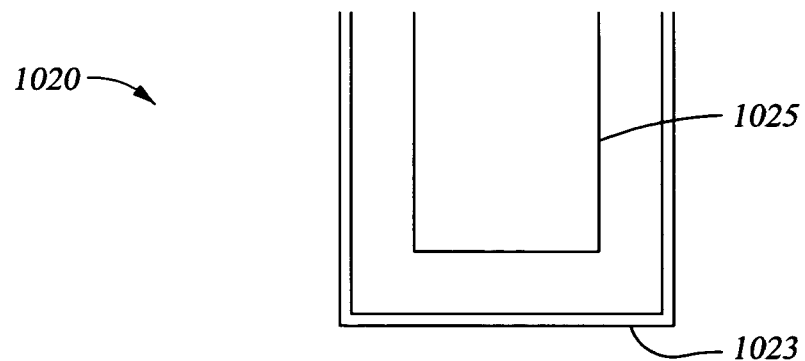
Figure 10B:
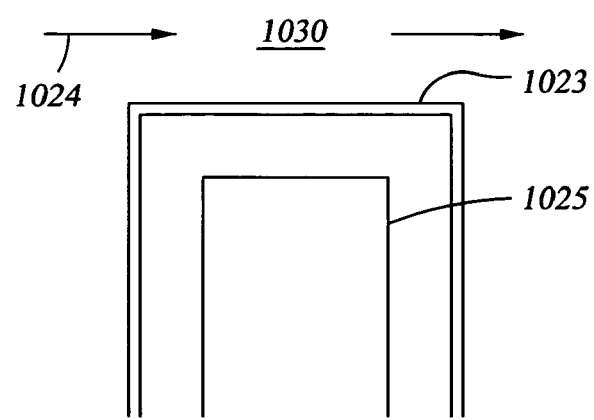

FIG. 10A shows a nozzle structure 1000 where the nozzle includes two chambers, a first chamber 1010 having a first diameter, d-1, and a second chamber 1012 having a second, smaller diameter, d-2. The nozzle structure 1000 has a surface 1005 which is typically micromachined from a substrate such as silicon. A multilayered coating of the kind described herein is applied over the surface 1005, as a means of decreasing d-1 and d-2, so that finer patterns can be printed, while providing an exterior surface 1003 having the desired surface properties, depending on the liquid 1004 which is to be flowed over surface 1003.

FIG. 103B shows an orifice structure 1020 which employs the same concept of the multilayered coating as that used with reference to FIG. 10A. The orifice structure 1020 has a surface 1025 which is typically micromachined from a substrate such as silicon. A multilayered coating of the kind described herein is applied over the surface 1025 to provide a surface 1023 having the desired surface properties, depending on the liquid 1024 which is to be flowed over surface 1023.

Figure 11A:
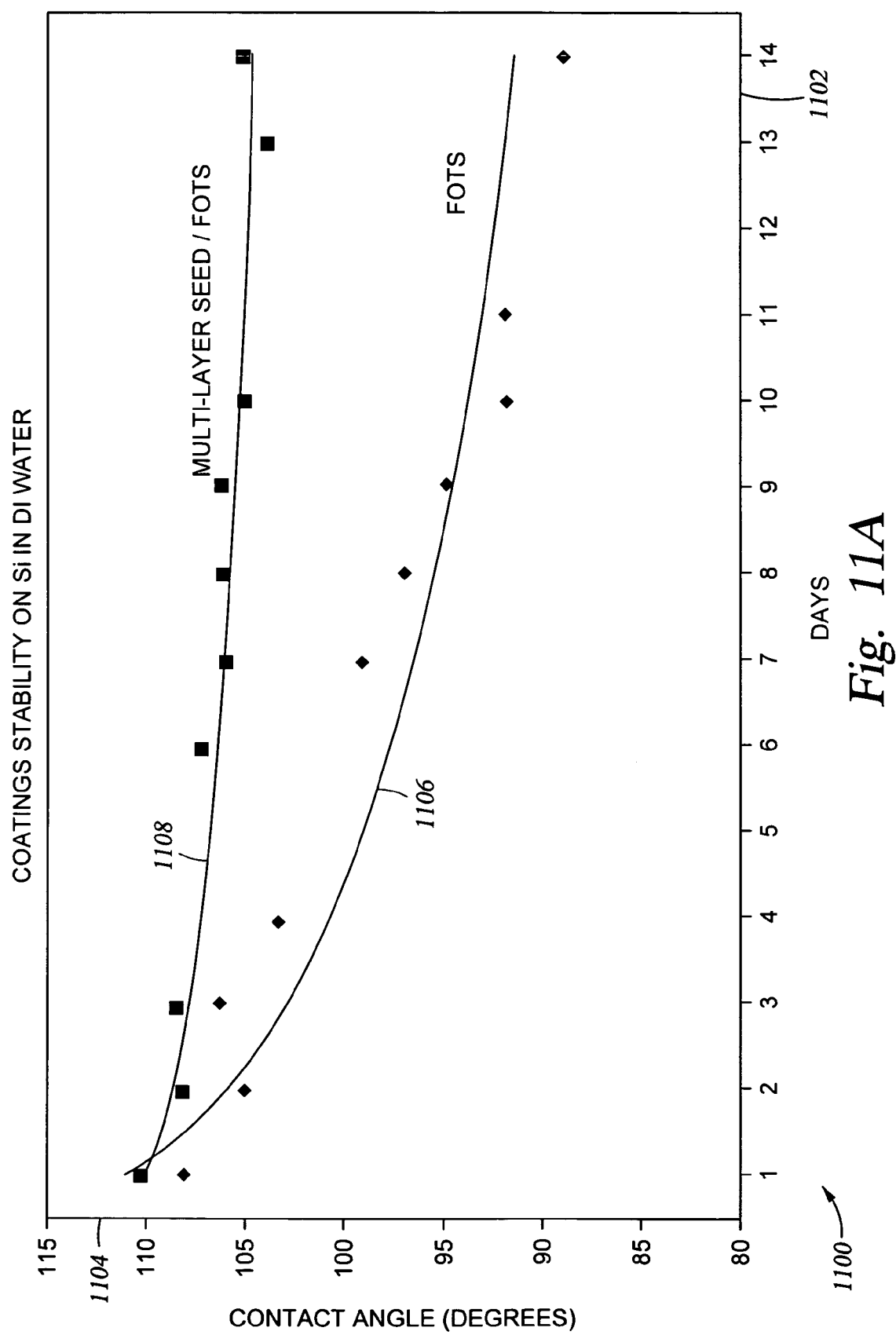
FIG. 11A illustrates the improvement in DI water stability of another multilayered coating, where the organic-based precursor was fluoro-tetrahydrooctyldimethylchlorosilanes (FOTS). The surface stability of a FOTS organic-based layer applied directly over the substrate surface is compared with the surface stability of a FOTS organic-based layer, which is the upper surface layer of a series of alternating layers of oxide-based layer followed by organic based layer.
Figure 11B:
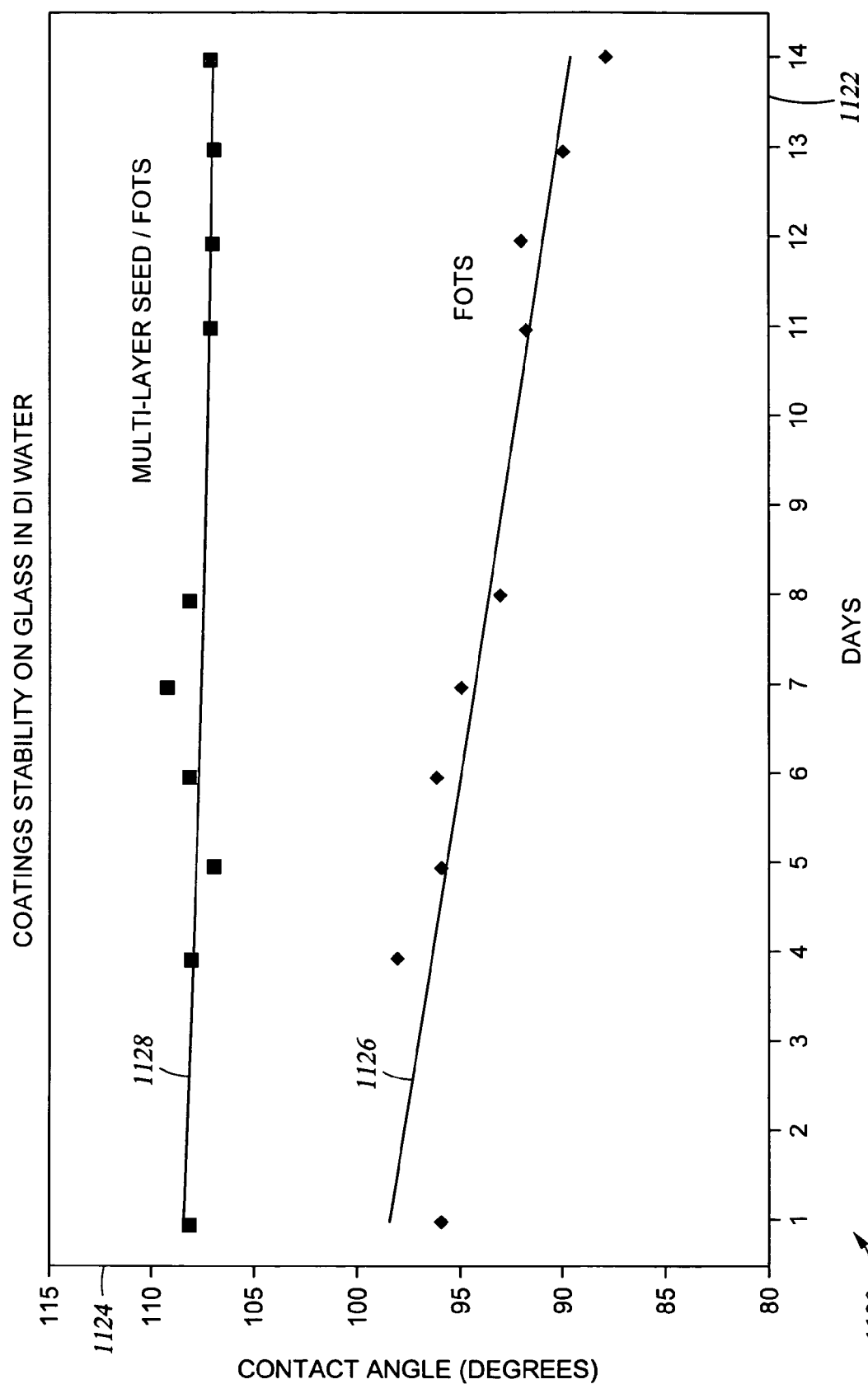
FIG. 11B shows the same kind of comparison as shown in FIG. 11A; however, the substrate is glass.
Figure 11C:
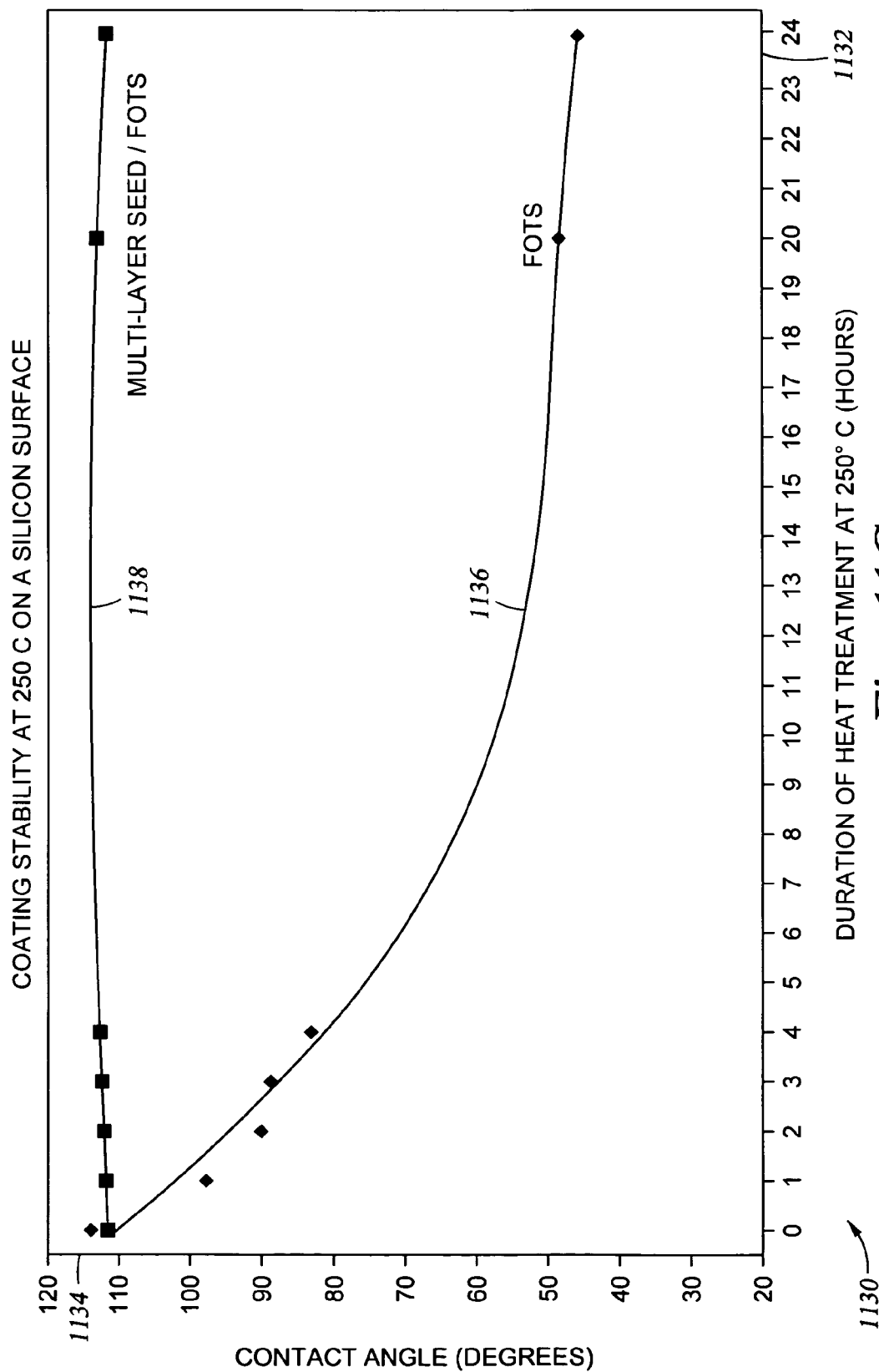
FIG. 11C shows comparative data for the five pairs oxide-based layer/organic-based layer structures of the kind described with respect to FIG. 11A, where the substrate is silicon; however, the stability data is for temperature rather than for exposure to DI water. The contact angle is shown after a number of hours at 250° C.

FIGS. 11A through 11C provide comparative examples which further illustrate the improvement in structure stability and surface properties for a SAM which is deposited from a FOTS precursor over a multilayered structure of the kind described above (with respect to a SAM deposited from FDTS).

FIG. 11A shows a graph 1100 which illustrates the improvement in DI water stability of a SAM when the organic-based precursor was fluoro-tetrahydrooctyldimethylchlorosilanes (FOTS) and the multilayered structure described was present beneath the FOTS based SAM layer. Curve 1108 shows physical property data (contact angle with a DI water droplet) for an approximately 800 Å thick layer of a SAM deposited from FOTS directly upon a single crystal silicon substrate which was oxygen plasma pre-treated in the manner previously described herein. The DI water droplet contact angle is shown on axis 1104 in degrees; the number of days of immersion of the substrate (with overlying oxide and SAM layer in place) is shown on axis 1102 in days. For a silicon substrate (which provides a hydrophilic surface), with the FOTS applied directly over the substrate, the stability of the organic-based SAM layer, in terms of the hygroscopic surface provided, decreases gradually from an initial contact angle of about 108° to a contact angle of less than about 90° after a 14 day time period, as illustrated by curve 1106.

This decrease in contact angle compares with a decrease in contact angle from about 110° to about 105° over the 14 day time period, when the structure is a series of five pairs of silicon oxide/FOTS SAM layers, with a SAM surface layer, as illustrated by curve 1108.

FIG. 11B shows a graph 1130 illustrating stability in DI water for the same FOTS organic-based SAM layer applied directly over the substrate or applied over a series of five pairs of silicon oxide/FOTS SAM layers, when the substrate is soda lime glass. The DI water droplet contact angle is shown on axis 1124 in degrees; the number of days of immersion of the substrate (with overlying oxide and SAM layer in place) is shown on axis 1122 in days.

When the FOTS SAM layer was applied directly over the substrate, the stability of the organic-based SAM layer, in terms of the hygroscopic surface provided, decreased gradually from an initial contact angle of about 98° to a contact angle of less than about 88° after a 14 day time period, as illustrated by curve 1126. This compares with a decrease in contact angle from about 108° to about 107° over the 14 day time period, when the structure is a series of five pairs of silicon oxide/FOTS SAM layers, as illustrated by curve 1128.

FIG. 11C shows a graph 1130 of the temperature stability in air at 250° C. for the same FOTS organic-based SAM layer applied directly over a single crystal silicon substrate versus the five pairs of silicon oxide/FOTS SAM layers. The duration of heat treatment in hours is shown on axis 1132, while the DI water contact angle for the SAM surface after the heat treatment is shown on axis 1134.

When the FOTS SAM layer was applied directly over the substrate, the stability of the organic-based SAM layer resulted in a decrease from an initial contact angle of about 111° to a contact angle of about 47° after a 24 hour exposure to a temperature of 250° C., as illustrated by Curve 1136. This compares with a constant contact angle at about 111° after the same 24 hour exposure to a temperature of 250° C., when the structure is a series of five pairs of silicon oxide/FOTS SAM layers, as illustrated by curve 1138.

The above described exemplary embodiments are not intended to limit the scope of the present invention, as one skilled in the art can, in view of the present disclosure expand such embodiments to correspond with the subject matter of the invention claimed below.

We claim:

1. A method of depositing a multilayered coating on a substrate, which coating is tailored to provide a particular characteristic behavior, wherein all layers of said multilayered coating are deposited from a vapor phase, wherein said multilayered coating includes at least one oxide-based layer and at least one organic-based layer, wherein the depositing from the vapor phase employs a stagnant source of reactive moieties during the formation of at least one layer, or a portion of at least one layer, of the multilayered coating, and wherein the stagnant source of reactive moieties is charged to a process chamber, without further addition during formation of the at least one layer or the portion of at least one layer.

2. A method in accordance with claim 1, wherein a plurality of oxide-based layers are deposited.

3. A method in accordance with claim 1, wherein at least one additional deposition step employs a non-reactive carrier gas to provide precursor species for deposition.

4. A method in accordance with claim 1, wherein said vapor phase deposition employs a stagnant source of reactive moieties during the formation of each layer of the coating, which source of reactive moieties is charged to the process chamber, without further addition during formation of each layer.

5. A method in accordance with claim 4, wherein said coating layer is deposited using a series of stepped addition and mixing steps during deposition.

6. A method in accordance with claim 1, wherein said method is carried out using a stepped addition of reactive moieties to be consumed during deposition of at least one individual coating layer of said multilayered coating.

7. A method in accordance with claim 6, wherein said individual coating layer is an oxide-based layer.

8. A method in accordance with claim 7, wherein a computer driven process control system is used to provide a series of additions of reactants to the process chamber during deposition of said individual coating layer.

9. A method in accordance with claim 6, wherein a computer driven process control system is used to provide a series of additions of reactants to the process chamber during deposition of said individual coating layer.

10. A method in accordance with claim 1, wherein a plasma treatment is carried out after the deposition of each organic-based layer which is not the final surface layer of the coating.

11. A method in accordance with claim 1, wherein said plurality of oxide-based layers and organic-based layers are deposited so that an oxide-based layer alternates with an organic-based layer.

12. A method in accordance with claim 1, wherein prior to deposition of a first organic-based layer on a substrate, an oxide-based layer is applied over said substrate.

13. A method in accordance with claim 12, wherein said oxide-based layer is deposited using a series of stepped depositions, and wherein a thickness of said oxide based layer ranges from about 5 Å to about 2000 Å.

14. A method in accordance with claim 13, wherein an exposed surface of said oxide-based layer contains —OH moieties.

15. A method in accordance with claim 13, wherein an exposed surface of said oxide-based layer contains halogen moieties.

16. A method in accordance with claim 15, wherein said halogen moieties comprise chlorine.

17. A method in accordance with claim 12, wherein an exposed surface of said oxide-based layer contains —OH moieties.

18. A method in accordance with claim 12, wherein an exposed surface of said oxide-based layer contains halogen moieties.

19. A method in accordance with claim 18, wherein said halogen moieties comprise chlorine.

20. A method in accordance with claim 12, wherein prior to deposition of said oxide-based layer, said substrate is treated using an oxygen-based plasma.

21. A method in accordance with claim 12, wherein said oxide-based layer is formed by a reaction between a chlorosilane vapor and water vapor.

22. A method in accordance with claim 21, wherein said chlorosilane vapor and said water vapor react essentially on said substrate surface.

23. A method in accordance with claim 21, wherein a combination of a partial pressure of a chlorosilane vaporous precursor and a partial pressure of a water vapor precursor are used to control said reaction between said chlorosilane precursor and said water precursor.

24. A method in accordance with claim 23, wherein said chlorosilane is selected from the group consisting of tetrachlorosilane, hexachlorosilane, hexachlorosiloxane and combinations thereof.

25. A method in accordance with claim 23, wherein a total pressure in said process chamber ranges from about 0.5 Torr to about 400 Torr, and a partial pressure of said chlorosilane vaporous precursor ranges from about 0.5 Torr to about 100 Torr.

26. A method in accordance with claim 25, wherein a substrate temperature during deposition of said oxide ranges from about 10° C. to about 130° C.

27. A method in accordance with claim 26, wherein a temperature of a major surface inside said processing chamber ranges from about 20° C. to about 150° C.

28. A method in accordance with claim 23, wherein a partial pressure of said water vapor precursor ranges from about 0.5 Torr to about 300 Torr.

29. A method in accordance with claim 23, wherein, subsequent to the deposition of said oxide and the creation of hydroxyl groups on said oxide surface, a vaporous organo-chlorosilane which includes a specific functional group is reacted with said hydroxyl groups to impart specific functional characteristics to said coating.

30. A method in accordance with claim 29, wherein a partial pressure of said organo-chlorosilane vaporous precursor is used to control said reaction between said organo-chlorosilane precursor and said hydroxyl groups so that said reaction occurs substantially on said substrate surface.

31. A method in accordance with claim 30, wherein said reaction occurs essentially on said substrate surface.

32. A method in accordance with claim 29, wherein said organo-silane vaporous precursor includes a functional moiety selected from the group consisting of an alkyl group, an alkoxyl group, an alkyl substituted group containing fluorine, an alkoxyl substituted group containing fluorine, a vinyl group, an ethynyl group, an epoxy group, a glycoxy group, an acrylo group, a glycol substituted group containing a silicon atom or an oxygen atom, an amino group, and combinations thereof.

33. A method in accordance with claim 32, wherein a total pressure in said process chamber ranges from about 0.5 Torr to about 30 Torr, and a partial pressure of said organo-chlorosilane vaporous precursor ranges from about 0.1 Torr to about 20 Torr.

34. A method in accordance with claim 33, wherein a substrate temperature during deposition of said organo-chlorosilane vaporous precursor ranges from about 10° C. to about 130° C.

35. A method in accordance with claim 34, wherein said temperature of said major process surface ranges from about 20° C. to about 150° C.

36. A method in accordance with claim 1, where more than 50% of the thickness contribution to the multilayered coating is provided by a plurality of oxide-based layers.

37. A method of controlling the surface roughness of a multilayered organo-silicon-containing coating on a substrate, wherein said multilayered coating is deposited from a vapor phase, wherein at least one layer is formed using an organosilane precursor which is introduced into a coating deposition chamber in which said multilayered coating is deposited, and wherein a surface roughness of at least one layer is further controlled by controlling a total pressure in said deposition chamber, a partial pressure of at least one precursor, and a temperature of a substrate on which said coating is deposited, wherein at least two organosilane precursors are introduced into said coating deposition chamber, followed by the introduction of water, whereby controllable co-deposition of said organosilane precursors is obtained.

38. A method in accordance with claim 37, wherein a partial pressure of said water vapor precursor is controlled to adjust said deposition rate or said surface roughness of said organo-silicon-containing coating.

39. A method of depositing a multilayered coating wherein an oxide-based layer thickness in direct contact with a substrate is controlled as a function of the chemical composition of said substrate, and wherein a SAM organic-based layer is deposited directly over said oxide-based layer, whereby an ability of said SAM organic-based layer to bond to said oxide-based layer is improved due to control of said oxide-based layer surface coverage and thickness.

40. A method of depositing a multilayered coating over a substrate, comprising deposition of at least two oxide-based layers and at least one organic-based layer, where each layer is deposited from a vapor phase, wherein said oxide based layer and said organic-based layer are alternated, wherein an oxide-based layer is deposited directly over a surface of said substrate, wherein said deposition employs a stagnant source of reactive moieties during the formation of at least one layer, or a portion of at least one layer, of the multilayered coating, and wherein the stagnant source of reactive moieties is charged to a process chamber, without further addition during formation of the at least one layer or the portion of at least one layer.

41. A method in accordance with claim 40, wherein said multilayered coating includes at least two oxide-based layers and at least two organic-based layers.

42. A method in accordance with claim 41, wherein said multilayered coating includes at least five oxide-based layers and at least five organic-based layers.

* * * * *